(12) United States Patent
Tsuda et al.

(10) Patent No.: US 12,710,453 B2
(45) Date of Patent: Aug. 18, 2026

(54) ELECTRIC CURRENT SENSOR DEVICE

(71) Applicant: AISIN CORPORATION, Kariya (JP)

(72) Inventors: Mamoru Tsuda, Kariya (JP); Noriaki Mitsubayashi, Kariya (JP); Kotaro Omote, Kariya (JP)

(73) Assignee: AISIN CORPORATION, Kariya (JP)

( * ) Notice: Subject to any disclaimer, the term of this patent is extended or adjusted under 35 U.S.C. 154(b) by 158 days.

(21) Appl. No.: 18/703,960

(22) PCT Filed: Dec. 26, 2022

(86) PCT No.: PCT/JP2022/048040
§ 371 (c)(1),
(2) Date: Apr. 23, 2024

(87) PCT Pub. No.: WO2023/136125
PCT Pub. Date: Jul. 20, 2023

(65) Prior Publication Data

US 2025/0231225 A1 Jul. 17, 2025

(30) Foreign Application Priority Data

Jan. 14, 2022 (JP) ................................ 2022-004555
Jun. 10, 2022 (JP) ................................ 2022-094671

(51) Int. Cl.
*G01R 15/20* (2006.01)
*G01R 19/00* (2006.01)

(52) U.S. Cl.
CPC ....... *G01R 15/207* (2013.01); *G01R 19/0092* (2013.01); *G01R 15/202* (2013.01)

(58) Field of Classification Search
CPC .............. G01R 15/207; G01R 19/0092; G01R 15/202; G01R 15/20
See application file for complete search history.

(56) References Cited

U.S. PATENT DOCUMENTS

2003/0001559 A1 1/2003 Goto et al.
2006/0082357 A1 4/2006 Tsukamoto
(Continued)

FOREIGN PATENT DOCUMENTS

CN 108254609 A 7/2018
JP 2003-510612 A 3/2003
(Continued)

OTHER PUBLICATIONS

Dec. 11, 2024 extended Search Report issued in European Patent Application No. 22920642.0.
(Continued)

*Primary Examiner* — Lee E Rodak
*Assistant Examiner* — Zannatul Ferdous
(74) *Attorney, Agent, or Firm* — Oliff PLC

(57) ABSTRACT

An electric current sensor device includes a first detector including first and second magnetic detection elements that detect magnetism generated by a current flowing through a first conductor, the first detector detecting a current of the first conductor based on results of the elements, and a second detector including third and fourth detection elements that detect magnetism generated by the second conductor, the second detector detecting a current of the second conductor based on results of the third and fourth elements. The first conductor includes a first wide portion with a first width through which a current flows in a first direction, and a first narrow portion through which a current flows in a second direction, whose width is a second width narrower than the first, and the first and second elements are arranged in a stacking direction of the first narrow portion, and side by side along the surface.

12 Claims, 21 Drawing Sheets

(56) References Cited

U.S. PATENT DOCUMENTS

| | | | | |
|---|---|---|---|---|
| 2007/0080676 | A1 | 4/2007 | Racz et al. | |
| 2012/0326716 | A1 | 12/2012 | Kawase | |
| 2014/0139203 | A1 | 5/2014 | Hozumi et al. | |
| 2019/0361055 | A1* | 11/2019 | Hebiguchi | G01R 19/0092 |
| 2021/0063446 | A1* | 3/2021 | Miyamoto | G01R 15/205 |
| 2021/0080489 | A1* | 3/2021 | Koizumi | G01R 15/207 |
| 2022/0091161 | A1* | 3/2022 | Houis | G01R 15/202 |

FOREIGN PATENT DOCUMENTS

| | | | |
|---|---|---|---|
| JP | 2006-112968 | A | 4/2006 |
| JP | 2010-127896 | A | 6/2010 |
| JP | 2018-141634 | A | 9/2018 |
| WO | 2011/118184 | A1 | 9/2011 |
| WO | 2013/058282 | A1 | 4/2013 |

OTHER PUBLICATIONS

Mar. 7, 2023 International Search Report issued in International Patent Application No. PCT/JP2022/048040.

* cited by examiner 7
d1
112
21a
11n
D1
D2
21b
21
111
w2
11w
11
w1
p1
121
22a
22b
D3
D4
22
12n
w3
w4
122
12w
12
100a
w6
132
23a
23b
13n
100b
D5
D6
23
w5
131
d2
13w
13

(a)

[First comparative example]

(b)

[Second comparative example]

(c)

[Third comparative example]

(a)

[Fourth comparative example]

(b)

[Fifth comparative example]

ELECTRIC CURRENT SENSOR DEVICE

TECHNICAL FIELD

The present technology relates to an electric current sensor device that measures a current flowing through a conductor.

BACKGROUND ART

Conventionally, an electric current sensor device for measuring a current is provided in a device using a relatively large current, such as an inverter for a three-phase AC motor. As such an electric current sensor device, for example, there is known an electric current sensor device in which a slit for changing a current flow direction is provided in a conductor (hereinafter, referred to as "bus bar") and a magnetic detection element is disposed in the slit (see Patent Literature 1). In this electric current sensor device, a current flows around the magnetic detection element to draw an arc, and the magnetic flux input to the magnetic detection element is increased to improve an SN ratio. Two magnetic detection elements are provided, magnetic fluxes in positive and negative directions are input to these magnetic detection elements, and positive and negative voltages are generated in the magnetic detection elements. A signal processing circuit then calculates a differential voltage to detect the current. In addition, a configuration in which a plurality of bus bars to which such an electric current sensor device is attached are arranged at predetermined intervals is known (see Patent Literature 2).

CITATION LIST

Patent Literature

Patent Literature 1: JP 2018-141634 A
Patent Literature 2: JP 2003-510612 W

SUMMARY OF DISCLOSURE

Technical Problems

Since a large current flows through a bus bar, if the distance between slits is small, the amount of heat generated between the slits locally increases. In the electric current sensor devices described in Cited Literatures 1 and 2, since the magnetic detection element is provided in the slit, it is difficult to reduce the interval between two magnetic detection elements if the distance between the slits is secured to reduce the amount of heat generated. For this reason, the package that houses the two magnetic detection elements becomes large in size. On the other hand, it is also possible to separately provide two packages each of which houses the magnetic detection element without housing the two magnetic detection element in a single package, but in this case, it is necessary to externally provide a signal processing circuit, which leads to an increase in size of the entire device.

In addition, in the electric current sensor device described in Cited Literature 2, since a plurality of bus bars are arranged, a magnetic flux generated when a current flows through one bus bar possibly affects a magnetic detection element provided in an adjacent bus bar, and there is a possibility that current detection accuracy is lowered. It is also conceivable to reduce the influence of the magnetic flux from the adjacent bus bar by calculating a differential voltage in the signal processing circuit. However, when the interval between the bus bars is reduced, the effect of this method also decreases. Therefore, the interval between the bus bars cannot be reduced, and the entire device may be increased in size.

Therefore, the present disclosure provides an electric current sensor device that is provided on a plurality of conductors arranged at predetermined intervals, and can be downsized while detection accuracy is ensured.

Solutions to Problems

An electric current sensor device according to one aspect of the present disclosure includes a first conductor and a second conductor arranged at a predetermined interval, a first detector including a first magnetic detection element and a second magnetic detection element that detect magnetism generated by a current flowing through the first conductor, and the first detector detecting a current of the first conductor based on detection results of the first magnetic detection element and the second magnetic detection element, and a second detector including a third magnetic detection element and a fourth magnetic detection element that detect magnetism generated by a current flowing through the second conductor, and the second detector detecting a current of the second conductor based on detection results of the third magnetic detection element and the fourth magnetic detection element, and in the electric current sensor device, the first conductor includes a first wide portion through which a current flows in a first direction and whose width in a direction orthogonal to the first direction is a first width, and a first narrow portion through which a current flows in a second direction intersecting the first direction and whose width in a direction orthogonal to the second direction is a second width narrower than the first width, the first magnetic detection element and the second magnetic detection element are arranged in a first stacking direction of a surface of the first narrow portion, and are arranged side by side in a direction along the surface of the first narrow portion, the second conductor includes a second wide portion through which a current flows in a third direction and whose width in a direction orthogonal to the third direction is a third width, and a second narrow portion through which a current flows in a fourth direction intersecting the third direction and whose width in a direction orthogonal to the fourth direction is a fourth width narrower than the third width, and the third magnetic detection element and the fourth magnetic detection element are arranged in a second stacking direction of a surface of the second narrow portion, and are arranged side by side in a direction along the surface of the second narrow portion.

An electric current sensor device according to another aspect of the present disclosure includes a conductor, and a detector including a first magnetic detection element and a second magnetic detection element that detect magnetism generated by a current flowing through the conductor, and the detector detecting a current of the conductor based on detection results of the first magnetic detection element and the second magnetic detection element, and in the electric current sensor device, the conductor includes a wide portion through which a current flows in a first direction and whose width in a direction orthogonal to the first direction is a first width, a narrow portion through which a current flows in a second direction intersecting the first direction and whose width in a direction orthogonal to the second direction is a second width narrower than the first width, a first recess defining an upstream side in the first direction of the narrow portion and having a shape recessed in a direction opposite to the second direction with a side edge on a downstream side in the second direction of two side edges of the wide portion as a proximal end, and a second recess defining a downstream side in the first direction of the narrow portion and having a shape recessed in the second direction with a side edge on an upstream side in the second direction of two side edges of the wide portion as a proximal end, the first magnetic detection element and the second magnetic detection element are arranged in a stacking direction of a surface of the narrow portion, and are arranged side by side in a direction along the surface of the narrow portion, in the first recess, a width in the first direction of a first portion including the proximal end is defined as a first recess width, and a width in the first direction of a second portion including a distal end in a direction opposite to the second direction is defined as a second recess width smaller than the first recess width, and when viewed from the first direction, a distal end of the first recess matches a distal end of the second recess, or at least a part of the second portion overlaps the second recess.

Therefore, the present disclosure is provided on a plurality of conductors arranged at predetermined intervals, and downsizing can be achieved while detection accuracy is ensured.

DESCRIPTION OF EMBODIMENTS

First Embodiment

Hereinafter, a first embodiment of an electric current sensor device according to the present disclosure will be described with reference to FIGS. 1 to 10. In the present embodiment, a case where the electric current sensor device is mounted on an inverter device 3 for controlling a three-phase AC motor 2 for driving a vehicle will be described.

Figure 1:
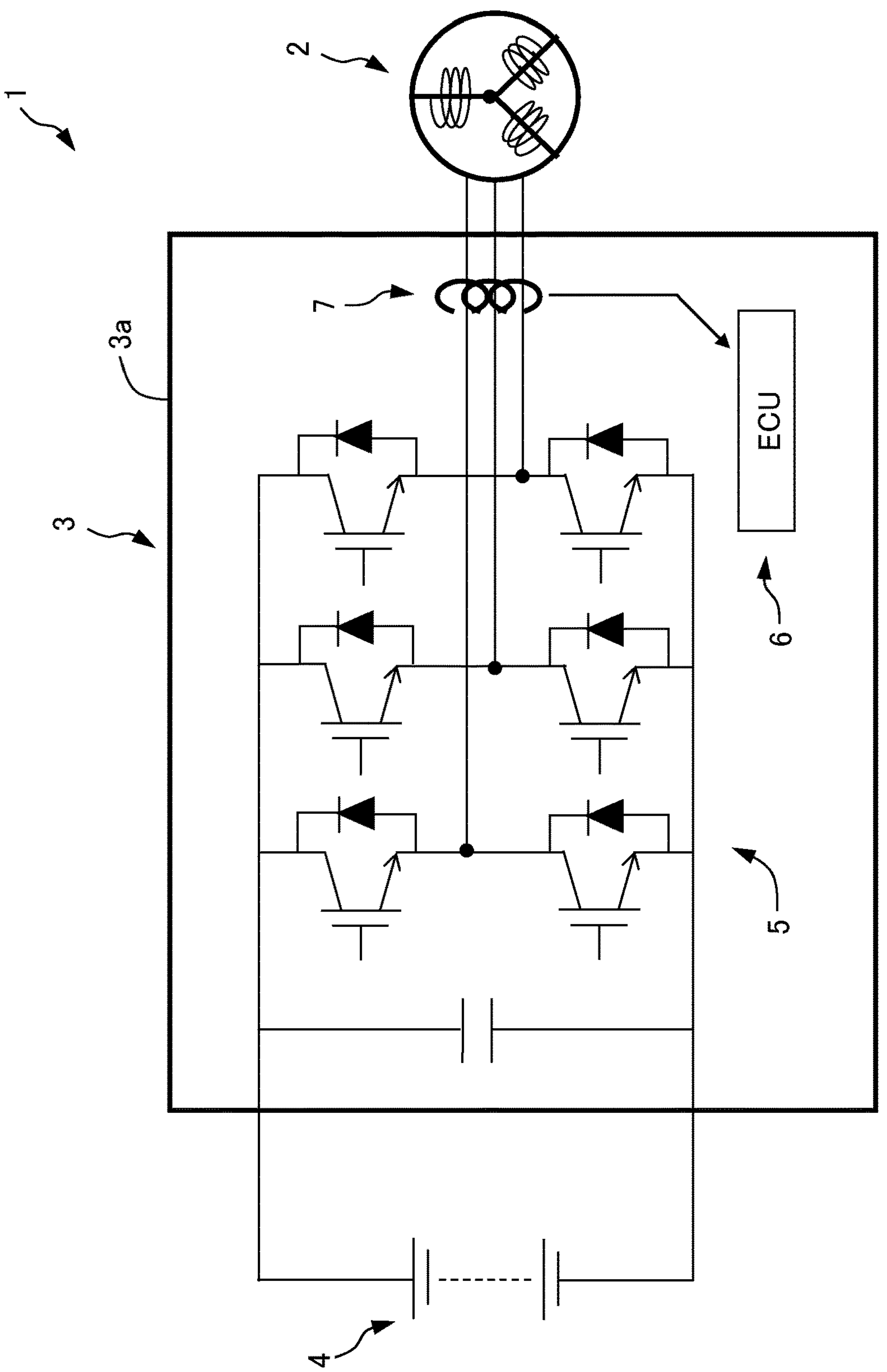
FIG. 1 is a schematic diagram illustrating a vehicle according to a first embodiment.

First, the outline of a vehicle 1 will be described with reference to FIG. 1. The vehicle 1 is a vehicle that can travel using the three-phase AC motor 2 as a drive source, such as an electric car or a hybrid car. The vehicle 1 includes the three-phase AC motor 2, the inverter device 3 for controlling the three-phase AC motor 2, and a power supply 4. The three-phase AC motor 2 is a three-phase induction motor, and has three phases of a U phase (first phase), a V phase (second phase), and a W phase (third phase) in the present embodiment. Note that the three-phase AC motor 2 is an example of a rotary electric machine that operates with a three-phase alternating current, and a known motor can be applied, and thus detailed description of the configuration and the like is omitted.

The inverter device 3 includes an inverter circuit 5, an ECU 6, and an electric current sensor device 7. The inverter circuit 5 includes a switching element corresponding to each phase of the three-phase AC motor 2, and controls an output to each phase by controlling the ECU 6 to operate the three-phase AC motor 2. Note that a known inverter circuit and a known ECU can be applied as the inverter circuit 5 and the ECU 6, and thus detailed description of the configuration and the like is omitted.

The electric current sensor device 7 is connected between the inverter circuit 5 and the three-phase AC motor 2. In the present embodiment, the electric current sensor device 7 is attached to an aluminum die-cast case 3*a* of the inverter device 3.

[Electric Current Sensor Device]

Figure 2:
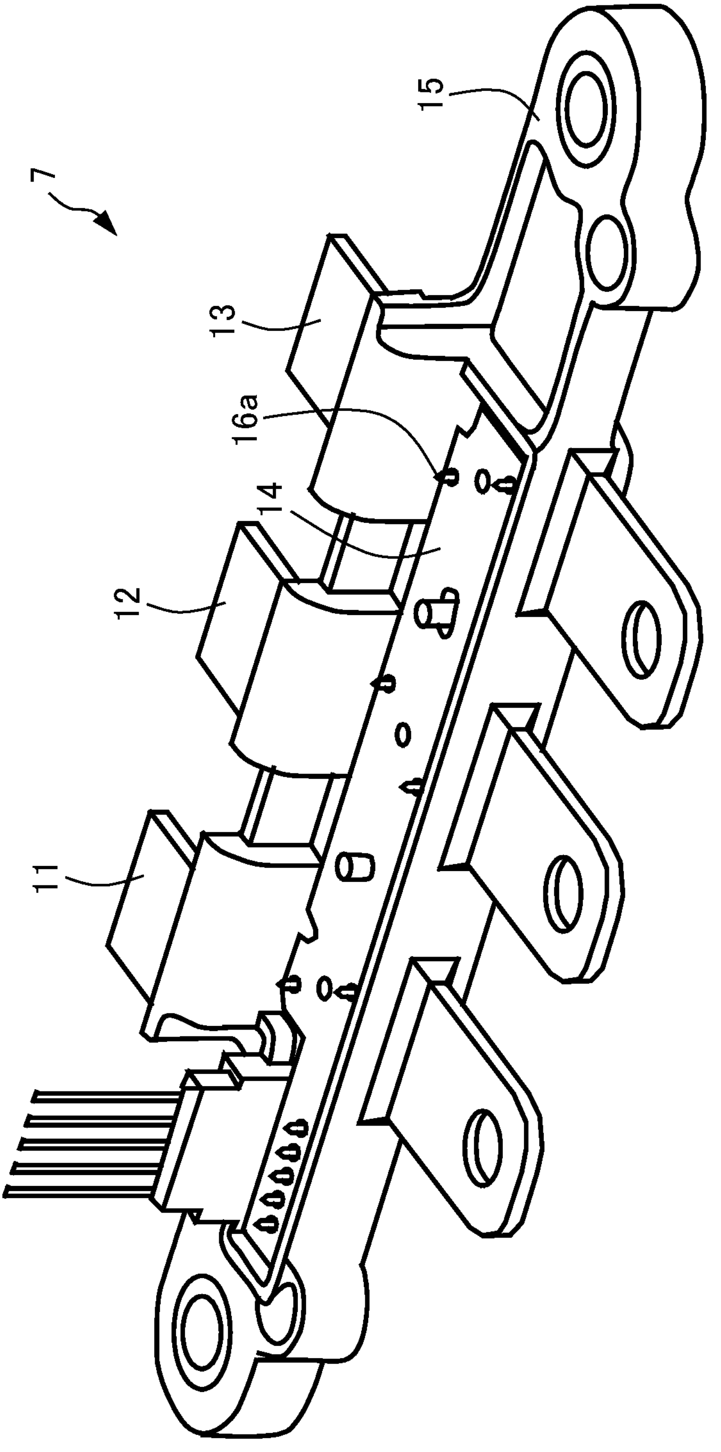
FIG. 2 is a perspective view illustrating an electric current sensor device according to the first embodiment.
Figure 3:
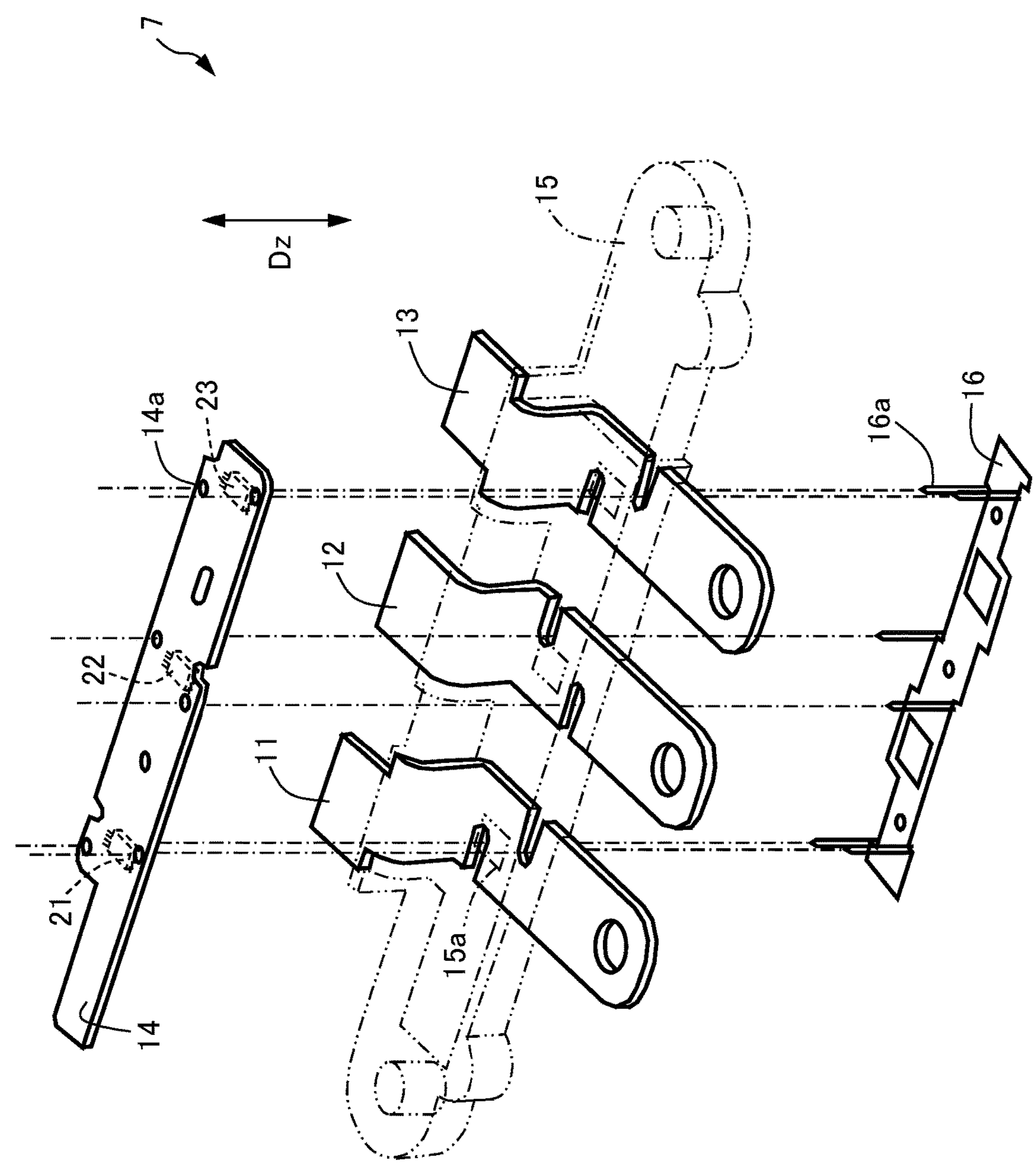
FIG. 3 is an exploded perspective view illustrating the electric current sensor device according to the first embodiment.
Figure 4:
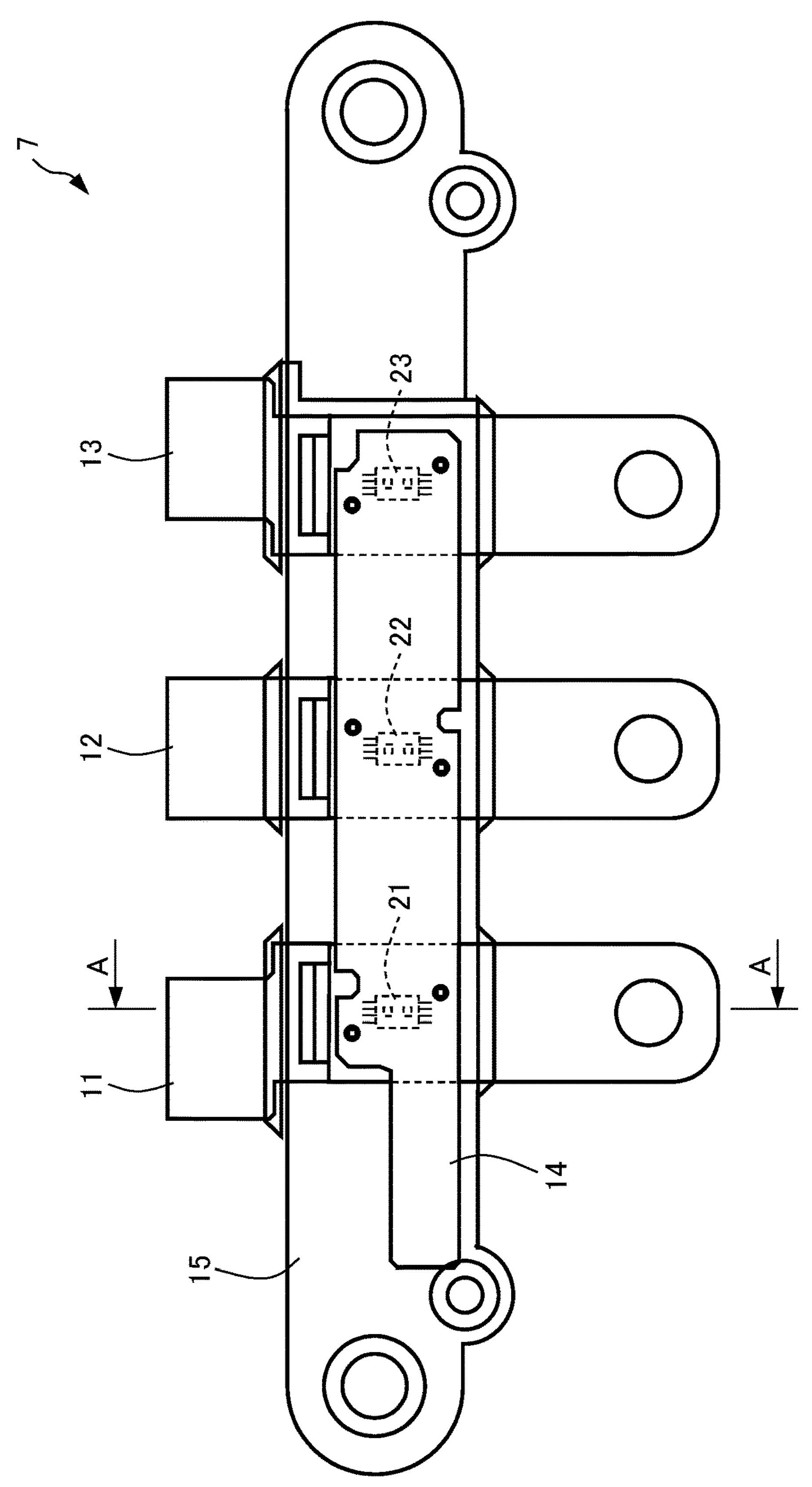
FIG. 4 is a plan view illustrating the electric current sensor device according to the first embodiment.

Hereinafter, the electric current sensor device 7 will be described with reference to FIGS. 2 to 10. First, the overall configuration of the electric current sensor device 7 will be described with reference to FIGS. 2 to 4. As illustrated in FIGS. 2 to 4, the electric current sensor device 7 includes three bus bars 11, 12, and 13 individually connected to three phases, a board 14, a housing 15 made of resin, and a heat sink 16 made of metal.

The bus bars 11, 12, and 13 are examples of conductors, and are made of copper, for example. The bus bar 11, which is an example of a first conductor, is connected to a U-phase coil of the three-phase AC motor 2. The bus bar 12, which is an example of a second conductor, is connected to a V-phase coil. The bus bar 13, which is an example of a third conductor, is connected to a W-phase coil. Each of the bus bars is connected to the inverter circuit 5 (see FIG. 1). The bus bars 11, 12, and 13 are arranged at predetermined intervals. In the present embodiment, a first width w1 (see FIG. 5), which is the width of the bus bars 11, 12, and 13, is 10 mm, and a pitch p1 (see FIG. 5) between the bus bars 11, 12, and 13 is 14 mm. However, the first width w1 of and the pitch p1 between the bus bars 11, 12, and 13 are not limited thereto, and may be other values, or the pitch between the bus bars 11 and 12 and the pitch between the bus bars 12 and 13 may be different from each other.

The board 14 is an example of a first board and a second board, is a printed circuit board on which electronic components are mounted, and in the present embodiment, magnetic detection packages 21, 22, and 23 are mounted thereon. The bus bars 11, 12, and 13, the packages 21, 22, and 23, and the board 14 are stacked in a stacking direction Dz. The heat sink 16 is an example of a heat dissipation member, and is disposed on the side opposite to the board 14 with respect to the bus bars 11, 12, and 13 in the stacking direction Dz. Details of the heat sink 16 will be described later.

[Package]

Figure 5:
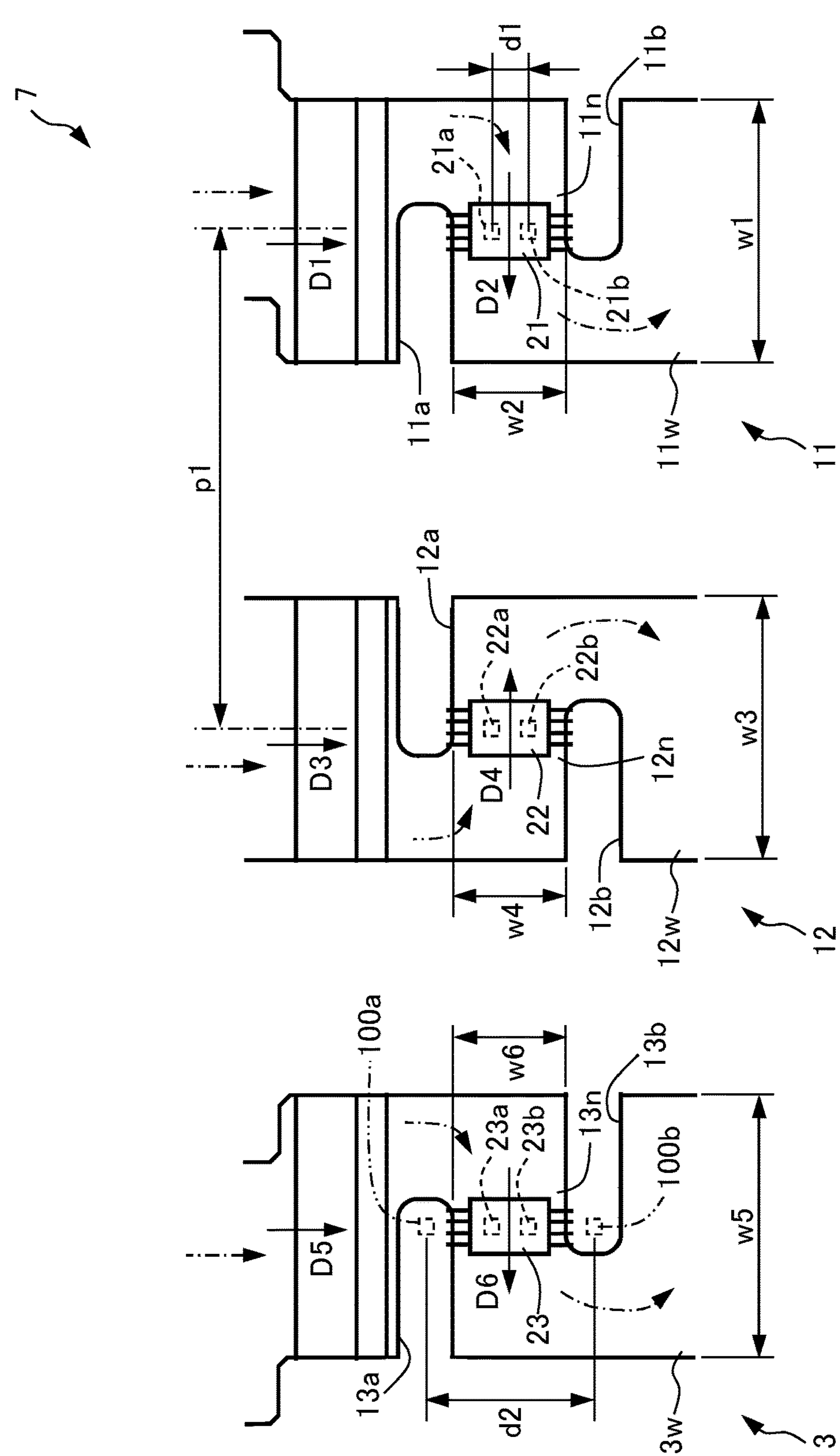
FIG. 5 is a plan view of a main part illustrating the electric current sensor device according to the first embodiment.
Figure 6:
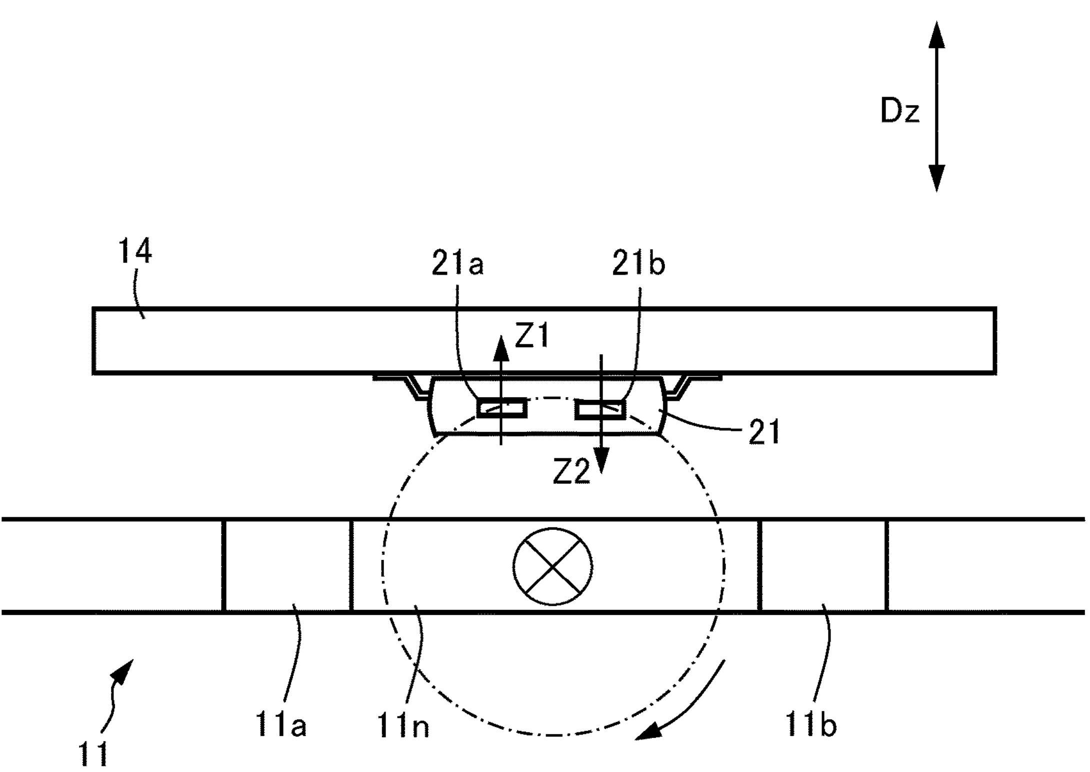
FIG. 6 is a cross-sectional view taken along line A-A in FIG. 4.
Figure 7:
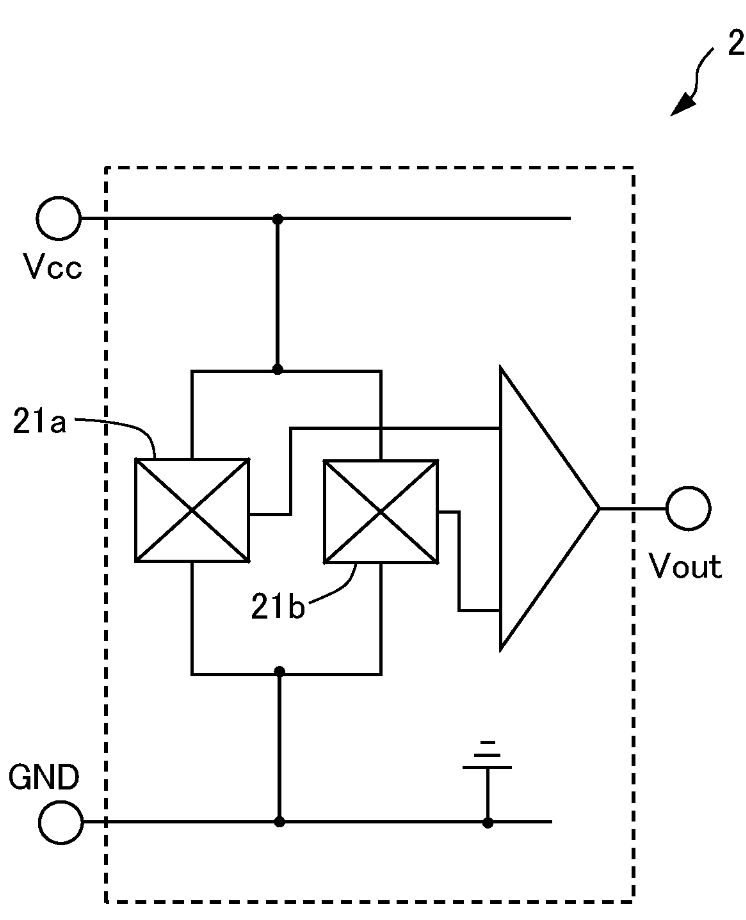
FIG. 7 is a wiring diagram illustrating a package according to the first embodiment.

Next, the packages 21, 22, and 23 will be described in detail with reference to FIGS. 5 to 7. Each of the packages 21, 22, and 23 is a sensor that incorporates two magnetic detection elements therein and measures a magnetic flux. The package 21 is disposed facing the bus bar 11 so as to measure a magnetic flux generated when the bus bar 11 is energized, the package 22 is disposed facing the bus bar 12 so as to measure a magnetic flux generated when the bus bar 12 is energized, and the package 23 is disposed facing the bus bar 13 so as to measure a magnetic flux generated when the bus bar 13 is energized. In FIG. 5, dashed-dotted line arrows in the bus bars 11, 12, and 13 indicate current flow directions. Note that, in the present embodiment, the packages 21, 22, and 23 are similar in configuration to each other except that the measurement target is different, and thus the package 21 will be described below as a representative, and the description of the packages 22 and 23 will be omitted. Similarly, the configurations of portions of the bus bars 11, 12, and 13 facing the packages 21, 22, and 23 are similar, and thus the bus bar 11 will be described below as a representative, and the description of the bus bars 12 and 13 will be omitted.

As illustrated in FIG. 5, the bus bar 11 includes slits 11*a* and 11*b* each of which has a shape cut out from a side edge on one side or a side edge on the other side to the center side in a longitudinal direction. The slits 11*a* and 11*b* are arranged to face each other in the longitudinal direction of the bus bar 11. The bus bar 11 includes a wide portion 11*w*, which is an example of a first wide portion, and 11*n*, which is an example of a first narrow portion. In the wide portion 11*w*, a current flows in a first direction D1, and the width in a direction orthogonal to the first direction D1 is the first width w1. The narrow portion 11*n* is a region between the slits 11*a* and 11*b*, and in the narrow portion, a current flows in a second direction D2 intersecting the first direction D1, and the width in a direction orthogonal to the second direction D2 is a second width w2 narrower than the first width w1. That is, in the narrow portion 11*n*, the current flow direction is changed.

Similarly, the bus bar 12 includes slits 12*a* and 12*b* each of which has a shape cut out from the side edge on one side or the side edge on the other side to the center side in the longitudinal direction. The slits 12*a* and 12*b* are arranged to face each other in the longitudinal direction of the bus bar 12. The bus bar 12 includes a wide portion 12*w*, which is an example of a second wide portion, and 12*n*, which is an example of a second narrow portion. In the wide portion 12*w*, a current flows in a third direction D3, and the width in a direction orthogonal to the third direction D3 is a third width w3. The narrow portion 12*n* is a region between the slits 12*a* and 12*b*, and in the narrow portion, a current flows in a fourth direction D4 intersecting the third direction D3, and the width in a direction orthogonal to the fourth direction D4 is a fourth width w4 narrower than the third width w3.

In addition, the bus bar 13 includes slits 13*a* and 13*b* each of which has a shape cut out from the side edge on one side or the side edge on the other side to the center side in the longitudinal direction. The slits 13*a* and 13*b* are arranged to face each other in the longitudinal direction of the bus bar 13. The bus bar 13 includes a wide portion 13*w*, which is an example of a third wide portion, and 13*n*, which is an example of a third narrow portion. In the wide portion 13*w*, a current flows in a fifth direction D5, and the width in a direction orthogonal to the fifth direction D5 is a fifth width w5. The narrow portion 13*n* is a region between the slits 13*a* and 13*b*, and in the narrow portion, a current flows in a sixth direction D6 intersecting the fifth direction D5, and the width in a direction orthogonal to the sixth direction D6 is a sixth width w6 narrower than the fifth width w5.

Note that, in the present embodiment, the direction in which the slit is cut out is the same in the bus bars 11 and 13, and the direction in the bus bars 11 and 13 is opposite to the direction in the bus bar 12, but it is not limited thereto, and the directions may be the same in the bus bars 11, 12, and 13.

The package 21 is an example of a first detector, and includes two magnetic detection elements that detect magnetism generated by a current flowing through the bus bar 11, that is, a first Hall element 21*a*, which is an example of a first magnetic detection element, and a second Hall element 21*b*, which is an example of a second magnetic detection element. The package 21 detects the current of the bus bar 11 on the basis of the detection results of the first Hall element 21*a* and the second Hall element 21*b*. The first Hall element 21*a* and the second Hall element 21*b* are arranged side by side in a manner to be stacked on the narrow portion 11*n* of the bus bar 11 and to be adjacent to each other. That is, the first Hall element 21*a* and the second Hall element 21*b* are arranged in the first stacking direction Dz (see FIG. 6) of the surface of the narrow portion 11*n* of the bus bar 11, and are arranged side by side in a direction along the surface of the narrow portion 11*n*.

Similarly, the package 22 is an example of a second detector, and includes two magnetic detection elements that detect magnetism generated by a current flowing through the bus bar 12, that is, a third Hall element 22*a*, which is an example of a third magnetic detection element, and a fourth Hall element 22*b*, which is an example of a fourth magnetic detection element. The package 22 detects the current of the bus bar 12 on the basis of the detection results of the third Hall element 22*a* and the fourth Hall element 22*b*. The third Hall element 22*a* and the fourth Hall element 22*b* are arranged side by side in a manner to be stacked on the narrow portion 12*n* of the bus bar 12 and to be adjacent to each other. That is, the third Hall element 22*a* and the third Hall element 22*b* are arranged in a second stacking direction Dz (see FIG. 6) of the surface of the narrow portion 12*n* of the bus bar 12, and are arranged side by side in a direction along the surface of the narrow portion 12*n*.

The package 23 is an example of a third detector, and includes two magnetic detection elements that detect magnetism generated by a current flowing through the bus bar 13, that is, a fifth Hall element 23*a*, which is an example of a fifth magnetic detection element, and a sixth Hall element 23*b*, which is an example of a sixth magnetic detection element. The package 23 detects the current of the bus bar 13 on the basis of the detection results of the fifth Hall element 23*a* and the sixth Hall element 23*b*. The fifth Hall element 23*a* and the sixth Hall element 23*b* are arranged side by side in a manner to be stacked on the narrow portion 13*n* of the bus bar 13 and to be adjacent to each other. That is, the fifth Hall element 23*a* and the sixth Hall element 23*b* are arranged in a third stacking direction Dz (see FIG. 6) of the surface of the narrow portion 13*n* of the bus bar 13, and are arranged side by side in a direction along the surface of the narrow portion 13*n*.

Here, the principle of measuring the magnetic flux of the bus bar 11 by the package 21 will be described with reference to FIG. 6. As illustrated in FIG. 6, it is assumed that a current flows through the narrow portion 11*n* of the bus bar 11 to the other side of the paper surface. At this time, a clockwise magnetic flux is generated around the narrow portion 11*n* with the current flow direction as the center. The package 21 is disposed to face the magnetic flux, and the first Hall element 21*a* can capture a magnetic flux in a direction Z1 away from the bus bar 11, and the second Hall element 21*b* can capture a magnetic flux in a direction Z2 approaching the bus bar 11. As illustrated in FIG. 7, the package 21 can generate a differential output between positive and negative voltages obtained by the first Hall element 21*a* and the second Hall element 21*b*, and the ECU 6 (see FIG. 1) can obtain a current value of the bus bar 11 on the basis of a signal output from the package 21.

Next, the relationship between a pitch d1 between the first Hall element 21*a* and the second Hall element 21*b* and the second width w2 of the narrow portion 11*n* will be described with reference to FIG. 5. If the second width w2 is less than twice the pitch d1, the narrow portion 11*n* is too thin, which may cause local overheating. If the second width w2 exceeds three times the pitch d1, the size of the electric current sensor device 7 increases. Therefore, the second width w2 is preferably twice or more and three times or less the pitch d1. In the present embodiment, the pitch d1 between the first Hall element 21*a* and the second Hall element 21*b* is, for example, 2.5 mm. The second width w2 of the narrow portion 11*n* is, for example, 6 mm. Similarly, the fourth width w4 of the narrow portion 12*n* and the sixth width w6 of the narrow portion 13*n* are preferably twice or more and three times or less the pitch d1, and in the present embodiment, the fourth width w4 and the sixth width w6 are, for example, 6 mm. Therefore, it is possible to achieve a balanced configuration without causing local overheating and without causing an increase in size of the electric current sensor device 7.

[Heat Sink]

Next, the heat sink 16 will be described with reference to FIGS. 3, 8, and 9. The heat sink 16 is coupled to the bus bars 11, 12, and 13 in a thermally conductive manner, and dissipates heat of the bus bars 11, 12, and 13. The heat sink 16 is made of metal made of a non-magnetic material such as brass, and does not affect the magnetic flux generated in the bus bars 11, 12, and 13, so that the detection accuracy can be maintained high.

In the present embodiment, the bus bars 11, 12, and 13 and the heat sink 16 are integrally formed with the resin housing 15 by injection molding. As illustrated in FIG. 8, the bus bar 11 and the heat sink 16 are not in direct contact with each other but are in contact with each other via the housing 15. However, heat of the bus bar 11 can be released from the heat sink 16 without interposing other components therebetween. The same applies to the bus bars 12 and 13. As illustrated in FIGS. 8 and 9, the heat sink 16 is exposed on the back side of the housing 15.

The electric current sensor device 7 is attached to the case 3*a* of the inverter device 3 via a heat sink sheet 8 in a manner that the heat sink 16 is in contact with the case 3*a* via the heat sink sheet 8. The case 3*a* is made of, for example, aluminum die-cast, and includes a flow path 3*b* through which cooling water (in FIG. 8, represented by an arrow) flows inside the wall portion. Therefore, the electric current sensor device 7 is preferably attached in the vicinity of the flow path 3*b* from the viewpoint of cooling efficiency.

Figure 8:
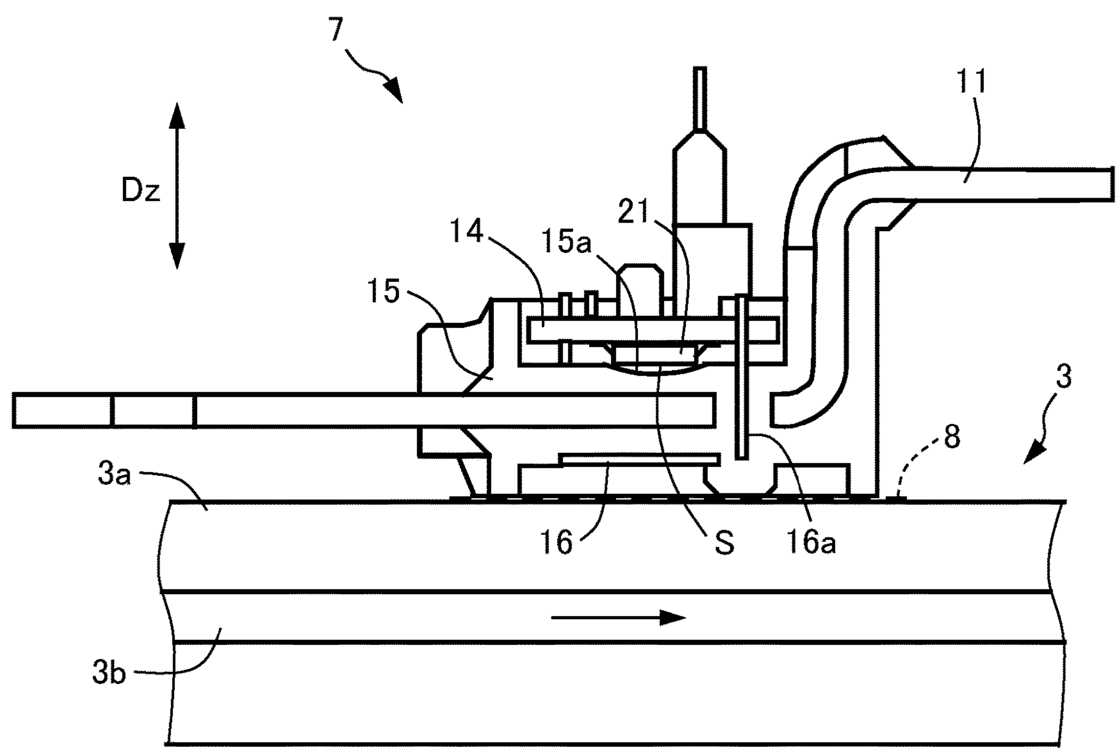
FIG. 8 is a cross-sectional view illustrating a state where the electric current sensor device according to the first embodiment is attached to a case of an inverter device.
Figure 9:
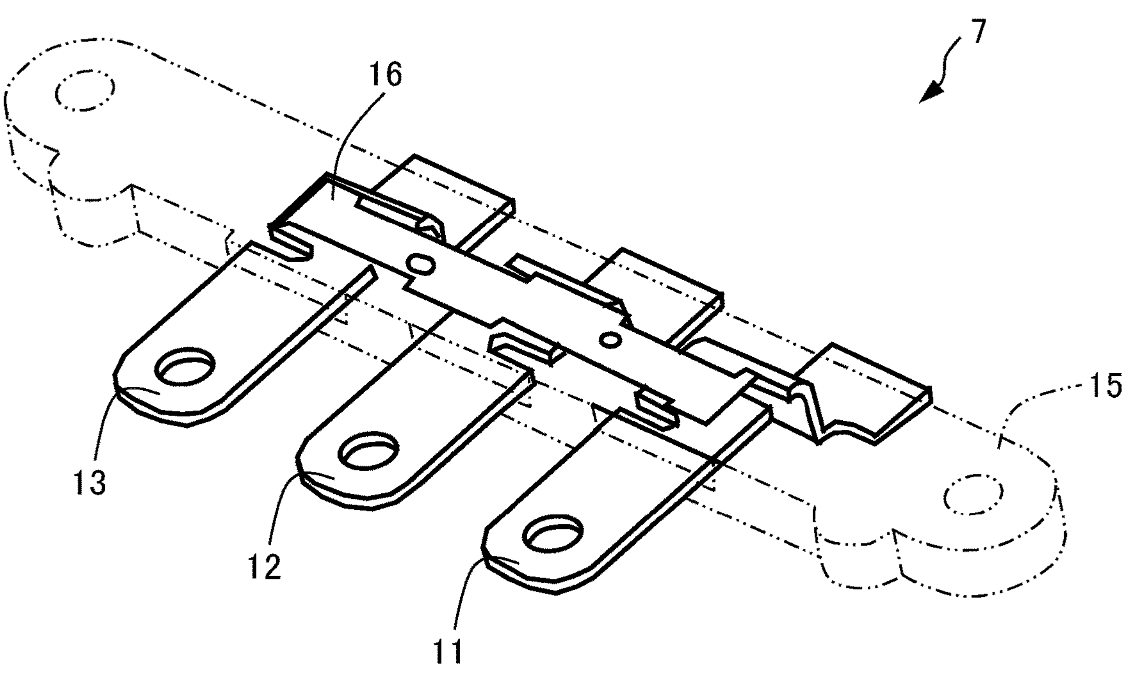
FIG. 9 is a perspective view illustrating the electric current sensor device according to the first embodiment as viewed from the back side.

As illustrated in FIGS. 3 and 8, the heat sink 16 includes a pin-shaped protrusion 16*a* protruding in the stacking direction Dz. In the present embodiment, six protrusions 16*a* are provided to pass through the slits of the bus bars 11, 12, and 13. The protrusion 16*a* is coupled to the board 14 in a thermally conductive manner by soldering. That is, the heat sink 16 can dissipate not only heat from the bus bars 11, 12, and 13 but also heat from the board 14 heated by the bus bars 11, 12, and 13.

As illustrated in FIGS. 3 and 8, a recess 15*a* is formed in a portion of the housing 15 facing the package 21. As a result, a space S, which is a first air layer, is formed between the package 21 and the housing 15. That is, the space S is interposed between the bus bar 11 and the package 21. Similarly, a space, which is a second air layer, is interposed between the bus bar 12 and the package 22, and a space, which is a third air layer, is interposed between the bus bar 13 and the package 23. As a result, the package 21 is not in direct contact with the housing 15 heated by the bus bar 11 and the air layer with low thermal conductivity is interposed therebetween, so that heating of the package 21 can be suppressed.

[Assembly and Attachment Procedure of Electric Current Sensor Device]

A procedure of assembling and attaching the electric current sensor device 7 described above will be described with reference to FIG. 3. The bus bars 11, 12, and 13 and the heat sink 16 are stacked in the stacking direction Dz and integrally formed with the housing 15 in advance. The board 14 is then attached to the housing 15 from the stacking direction Dz. At this time, the board 14 is supported by the housing 15.

Meanwhile, in the board 14, a through-hole 14*a* is formed at a position facing the protrusion 16*a* of the heat sink 16. While the protrusion 16*a* of the heat sink 16 is passed through the through-hole 14*a* of the board 14 and the board 14 is supported by the housing 15, the protrusion 16*a* is coupled to the board 14 in a thermally conductive manner by soldering. Furthermore, the electric current sensor device 7 is attached to the case 3*a* of the inverter device 3, and the packages 21, 22, and 23 are connected to the U-phase, V-phase, and W-phase coils of the three-phase AC motor 2 via the bus bars 11, 12, and 13, respectively.

Example

Figure 10:
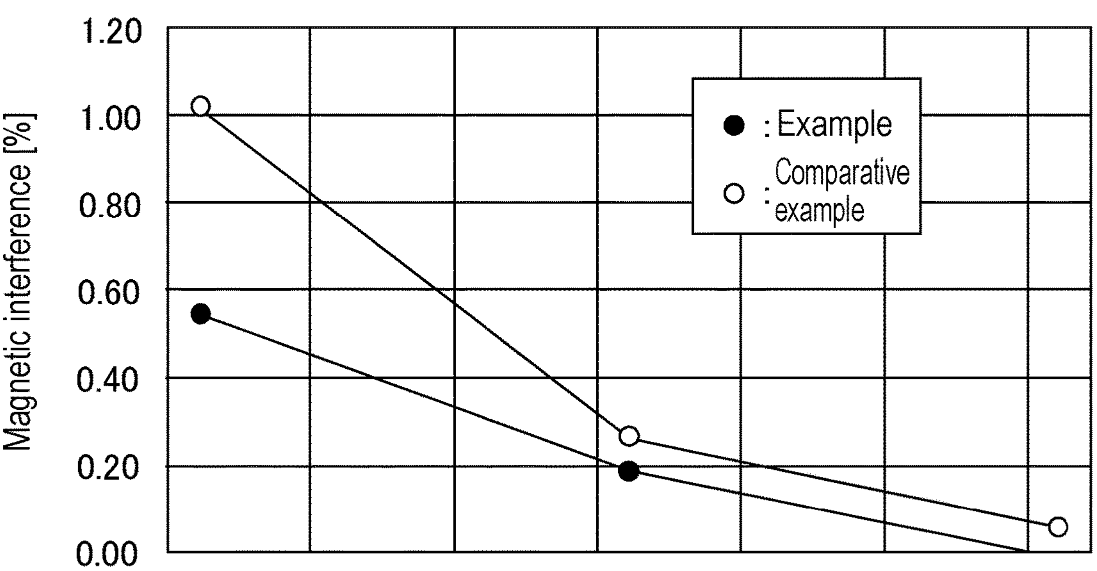
FIG. 10 is a graph illustrating a relationship between a bus bar pitch and magnetic interference in the electric current sensor device according to the first embodiment.

Measurement was performed using the electric current sensor device 7 described above. Here, a current was caused to flow through the bus bars 11 and 12, and the degree of magnetic interference from the bus bar 12 in the package 21 was measured with different pitches p1 between the bus bars 11 and 12. The results are illustrated in FIG. 10. As illustrated in FIG. 10, when the pitch p1 between the bus bars 11 and 12 was reduced, the degree of magnetic interference increased, but did not reach 1%, which is generally considered to be unfavorable.

Comparative Example

In a case where Hall elements 100*a* and 100*b* were arranged in slits of bus bars, measurement similar to that in the example was performed as a comparative example. The arrangement positions of the Hall elements 100*a* and 100*b* are illustrated using the bus bar 13 in FIG. 5. Note that this is illustrated for the sake of explanation, and the Hall elements 100*a* and 100*b* are not provided in the embodiment. Here, a pitch d2 between the Hall elements 100*a* and 100*b* was set to 9 mm. The results are illustrated in FIG. 10. As illustrated in FIG. 10, when the pitch p1 between the bus bars 11 and 12 was reduced, the degree of magnetic interference increased, and reached 1%, which is generally considered to be unfavorable at the pitch p1 wider than that of the example. Therefore, it was confirmed that in the example, high accuracy was maintained even if the pitch p1 between the bus bars 11 and 12 was narrower than that in the comparative example. As a result, by reducing the space between the bus bars with the same accuracy, the electric current sensor device 7 can be downsized.

As described above, according to the electric current sensor device 7 of the present embodiment, the first Hall element 21*a* and the second Hall element 21*b* are arranged in the stacking direction Dz of the surface of the narrow portion 11*n*, and are arranged side by side in the direction along the surface of the narrow portion 11*n*. Therefore, as compared with the case where the first Hall element 21*a* and the second Hall element 21*b* are disposed in the slits 11*a* and 11*b*, respectively, each of the Hall elements can be less susceptible to the influence of the magnetic flux from the adjacent bus bar 12. As a result, the pitch p1 between the bus bars 11, 12, and 13 can be reduced while the current detection accuracy is maintained, and thus the electric current sensor device 7 can be downsized.

In addition, according to the electric current sensor device 7 of the present embodiment, since the space S is interposed between the bus bar 11 and the package 21, it is possible to suppress the heating of the package 21 due to the heat of the bus bar 11.

Moreover, according to the electric current sensor device 7 of the present embodiment, the second width w2 of the narrow portion 11*n* is twice or more and three times or less the pitch d1 between the arrangement positions of the first Hall element 21*a* and the second Hall element 21*b*, and thus it is possible to avoid local overheating and to suppress an increase in size of the device.

Furthermore, according to the electric current sensor device 7 of the present embodiment, the electric current sensor device is provided in the inverter device 3 for the three-phase AC motor 2 mounted on the vehicle 1, and thus the vehicle 1 can be downsized.

Note that the case where the Hall element is applied as the magnetic detection element has been described in the present embodiment, but it is not limited thereto. That is, as long as the magnetic detection element can measure the magnetic flux generated by a current flow, for example, a magnetic impedance element, a magnetoresistive effect element, and the like can be widely applied as the magnetic detection element.

The case where the packages 21, 22, and 23 are mounted on one board 14 has been described in the present embodiment, but it is not limited thereto. For example, the packages 21, 22, and 23 may be mounted on separate boards.

Summary of Present Embodiment

Preferably, the electric current sensor device (7) includes a first conductor (11) and a second conductor (12) arranged at a predetermined interval, a first detector (21) including a first magnetic detection element (21*a*) and a second magnetic detection element (21*b*) that detect magnetism generated by a current flowing through the first conductor (11), and the first detector detecting a current of the first conductor (11) based on detection results of the first magnetic detection element (21*a*) and the second magnetic detection element (21*b*), and a second detector (22) including a third magnetic detection element (22*a*) and a fourth magnetic detection element (22*b*) that detect magnetism generated by a current flowing through the second conductor (12), and the second detector detecting a current of the second conductor (12) based on detection results of the third magnetic detection element (22*a*) and the fourth magnetic detection element (22*b*), and in the electric current sensor device, the first conductor (11) includes a first wide portion (11*w*) through which a current flows in a first direction (D1) and whose width in a direction orthogonal to the first direction (D1) is a first width (w1), and a first narrow portion (11*n*) through which a current flows in a second direction (D2) intersecting the first direction (D1) and whose width in a direction orthogonal to the second direction (D2) is a second width (w2) narrower than the first width (w1), the first magnetic detection element (21*a*) and the second magnetic detection element (21*b*) are arranged in a first stacking direction (Dz) of a surface of the first narrow portion (11*n*), and are arranged side by side in a direction along the surface of the first narrow portion (11*n*), the second conductor (12) includes a second wide portion (12*w*) through which a current flows in a third direction (D3) and whose width in a direction orthogonal to the third direction (D3) is a third width (w3), and a second narrow portion (12*n*) through which a current flows in a fourth direction (D4) intersecting the third direction (D3) and whose width in a direction orthogonal to the fourth direction (D4) is a fourth width (w4) narrower than the third width (w3), and the third magnetic detection element (22*a*) and the fourth magnetic detection element (22*b*) are arranged in a second stacking direction (Dz) of a surface of the second narrow portion (12*n*), and are arranged side by side in a direction along the surface of the second narrow portion (12*n*).

As a result, in the electric current sensor device (7), the first magnetic detection element (21*a*) and the second magnetic detection element (21*b*) are arranged in the first stacking direction (Dz) of the surface of the first narrow portion (11*n*), and are arranged side by side in the direction along the surface of the first narrow portion (11*n*). Therefore, as compared with the case where each of the first magnetic detection element (21*a*) and the second magnetic detection element (21*b*) is disposed in each of the slits (11*a*, 11*b*), each of the magnetic detection elements can be less susceptible to the influence of the magnetic flux from the adjacent second conductor (12). As a result, the pitch (p1) between the first conductor (11), the second conductor (12), and the third conductor (13) can be reduced while the current detection accuracy is maintained, and thus the electric current sensor device (7) can be downsized.

Preferably, the electric current sensor device (7) further includes

- a first board (14) on which the first detector (21) is mounted, and
- a second board (14) on which the second detector (22) is mounted, and in the electric current sensor device,
- the first conductor (11), the first detector (21), and the first board (14) are stacked in the first stacking direction (Dz), and a first air layer(S) is interposed between the first conductor (11) and the first detector (21), and
- the second conductor (12), the second detector (22), and the second board (14) are stacked in the second stacking direction (Dz), and a second air layer(S) is interposed between the second conductor (12) and the second detector (22).

As a result, in the electric current sensor device (7), the first air layer(S) is interposed between the first conductor (11) and the first detector (21), it is possible to suppress the heating of the first detector (21) due to the heat of the first conductor (11). Similarly, the second air layer(S) is interposed between the second conductor (12) and the second detector (22), it is possible to suppress the heating of the second detector (22) due to the heat of the second conductor (12).

In addition, preferably in the electric current sensor device (7),

- the second width (w2) of the first narrow portion (11*n*) is twice or more and three times or less a pitch between arrangement positions of the first magnetic detection element (21*a*) and the second magnetic detection element (21*b*), and
- the fourth width (w4) of the second narrow portion (12*n*) is twice or more and three times or less a pitch of arrangement positions of the third magnetic detection element (22*a*) and the fourth magnetic detection element (22*b*).

As a result, in the electric current sensor device (7), the second width (w2) of the first narrow portion (11*n*) is twice or more and three times or less the pitch (d1) between the arrangement positions of the first magnetic detection element (21*a*) and the second magnetic detection element (21*b*), and thus it is possible to avoid local overheating and to suppress an increase in size of the device.

Preferably, the electric current sensor device (7) further includes

- a third conductor (13) disposed at a predetermined interval from the second conductor (12), and
- a third detector (23) including a fifth magnetic detection element (23*a*) and a sixth magnetic detection element (23*b*) that detect magnetism generated by a current flowing through the third conductor (13), and the third detector detecting a current of the third conductor (13) based on detection results of the fifth magnetic detection element (23*a*) and the sixth magnetic detection element (23*b*), and in the electric current sensor device,
- the third conductor (13) includes a third wide portion (13*w*) through which a current flows in a fifth direction (D5) and whose width in a direction orthogonal to the fifth direction (D5) is a fifth width (w5), and a third narrow portion (13*n*) through which a current flows in a sixth direction (D6) intersecting the fifth direction (D5) and whose width in a direction orthogonal to the sixth direction (D6) is a sixth width (w6) narrower than the fifth width (w5),
- the fifth magnetic detection element (23*a*) and the sixth magnetic detection element (23*b*) are arranged in a third stacking direction (Dz) of a surface of the third narrow portion (13*n*), and are arranged side by side in a direction along the surface of the third narrow portion (13*n*), and
- the first detector (21), the second detector (22), and the third detector (23) are connected to first-phase, second-phase, and third-phase coils of a rotary electric machine (2) that operates with a three-phase alternating current via the first conductor (11), the second conductor (12), and the third conductor (13), respectively.

As a result, in the electric current sensor device (7), the electric current sensor device is provided in the inverter circuit (5) of the rotary electric machine (2) that is mounted on the vehicle (1) and operates with a three-phase alternating current, the vehicle (1) can be downsized.

Second Embodiment

Figure 11:
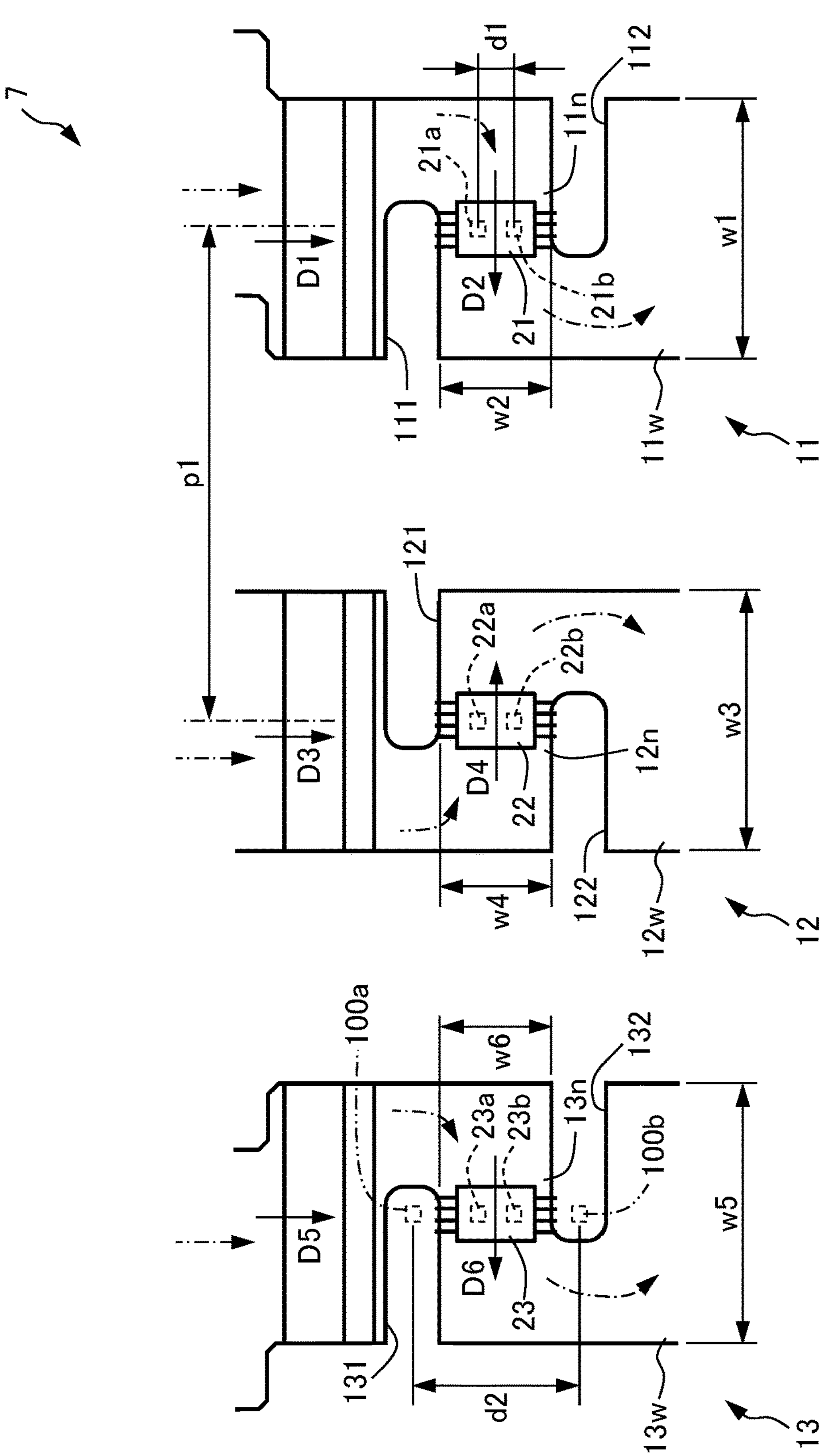
FIG. 11 is a plan view of a main part illustrating an electric current sensor device according to a second embodiment.

Next, a second embodiment of the present disclosure will be described in detail with reference to FIGS. 11 to 18. The present embodiment is different from the first embodiment in that the shapes of a first slit 111 and a second slit 112 are different from those of the first embodiment. However, other configurations are similar to those of the first embodiment, and thus the detailed description thereof will be omitted with the same reference numerals. Note that, in the present embodiment, as illustrated in FIG. 11, the bus bar 11 includes the slits 111 and 112 each of which has a shape cut out from the side edge on one side or the side edge on the other side to the center side in the longitudinal direction, the bus bar 12 includes slits 121 and 122 each of which has a shape cut out from the side edge on one side or the side edge on the other side to the center side in the longitudinal direction, and the bus bar 13 includes slits 131 and 132 each of which has a shape cut out from the side edge on one side or the side edge on the other side to the center side in the longitudinal direction.

[Shape of Slit]

Hereinafter, the shape of the slits in the bus bars 11, 12, and 13 will be described in detail with reference to FIG. 12. Since the slits of the bus bars 11, 12, and 13 have a similar shape, the description will be made using the bus bar 11 as a representative. The first slit 111 is an example of a first recess, defines the upstream side in the first direction D1 of the narrow portion 11*n*, and has a shape recessed in a direction opposite to the second direction D2 with the side edge on the downstream side in the second direction D2 of two side edges of the wide portion 11*w* as a proximal end 111*a*. The second slit 112 is an example of a second recess, defines the downstream side in the first direction D1 of the narrow portion 11*n*, and has a shape recessed in the second direction D2 with the side edge on the upstream side in the second direction D2 of the two side edges of the wide portion 11*w* as a proximal end 112*a*. When viewed from the first direction D1, at least a part of a second portion 1112 overlaps the second slit 112, and at least a part of a fourth portion 1122 overlaps the first slit 111.

In the first slit 111, the width in the first direction D1 of a first portion 1111 including the proximal end 111*a* is defined as a first recess width w11, and the width in the first direction D1 of the second portion 1112 including a distal end 111*b* in a direction opposite to the second direction D2 is defined as a second recess width w12 smaller than the first recess width w11. In the second slit 112, the width in the first direction D1 of a third portion 1121 including the proximal end 112*a* is defined as a third recess width w13, and the width in the first direction D1 of the fourth portion 1122 including a distal end 112*b* in the second direction D2 is defined as a fourth recess width w14 smaller than the third recess width w13.

In the present embodiment, in the first slit 111, the first portion 1111 has a substantially rectangular cutout shape, and the second portion 1112 has an approximately 270° arc shape around the vertex on the upstream side in the second direction D2 and the narrow portion 11*n* side of the first portion 1111. That is, at the distal end portion of the first portion 1111, the second portion 1112 with an arc outer diameter is formed continuously with the first portion 1111. Similarly, in the second slit 112, the third portion 1121 has a substantially rectangular cutout shape, and the fourth portion 1122 has an approximately 270° arc shape around the vertex on the downstream side in the second direction D2 of the third portion 1121 and on the narrow portion 11*n* side. That is, at the distal end portion of the third portion 1121, the fourth portion 1122 with an arc outer diameter is formed continuously with the third portion 1121. These first slit 111 and second slit 112 are formed at a time by, for example, punching the bus bar 11. Note that the method of forming the first slit 111 and the second slit 112 is not limited to punching, and the first and second slits may be formed by, for example, cutting.

In the present embodiment, the first recess width w11 is the width of the first portion 1111 with a rectangular parallelepiped shape and is 3 mm, and the second recess width w12 is the diameter of the second portion 1112 with an arc shape and is 1.5 mm. Similarly, the third recess width w13 is the width of the third portion 1121 with a rectangular parallelepiped shape and is 3 mm, and the fourth recess width w14 is the diameter of the fourth portion 1122 with an arc shape and is 1.5 mm. In the present embodiment, when viewed from the first direction D1, the distal end of the first portion 1111 in the direction opposite to the second direction D2 matches the distal end of the third portion 1121 in the second direction D2. Therefore, the distal end 111*b* of the second portion 1112 and the distal end 112*b* of the fourth portion 1122 are arranged to bite into the second direction, that is, arranged to overlap each other when viewed from the first direction D1, and a biting amount d10 is 1.5 mm. Furthermore, the second width w2 of the narrow portion 11*n* is an interval between the distal end of the second portion 1112 on the downstream side in the first direction D1 and the distal end of the fourth portion 1122 on the upstream side in the first direction D1, and is 4 mm in the present embodiment. However, each dimension is an example, it is not limited thereto, and other values may be used.

Figure 12:
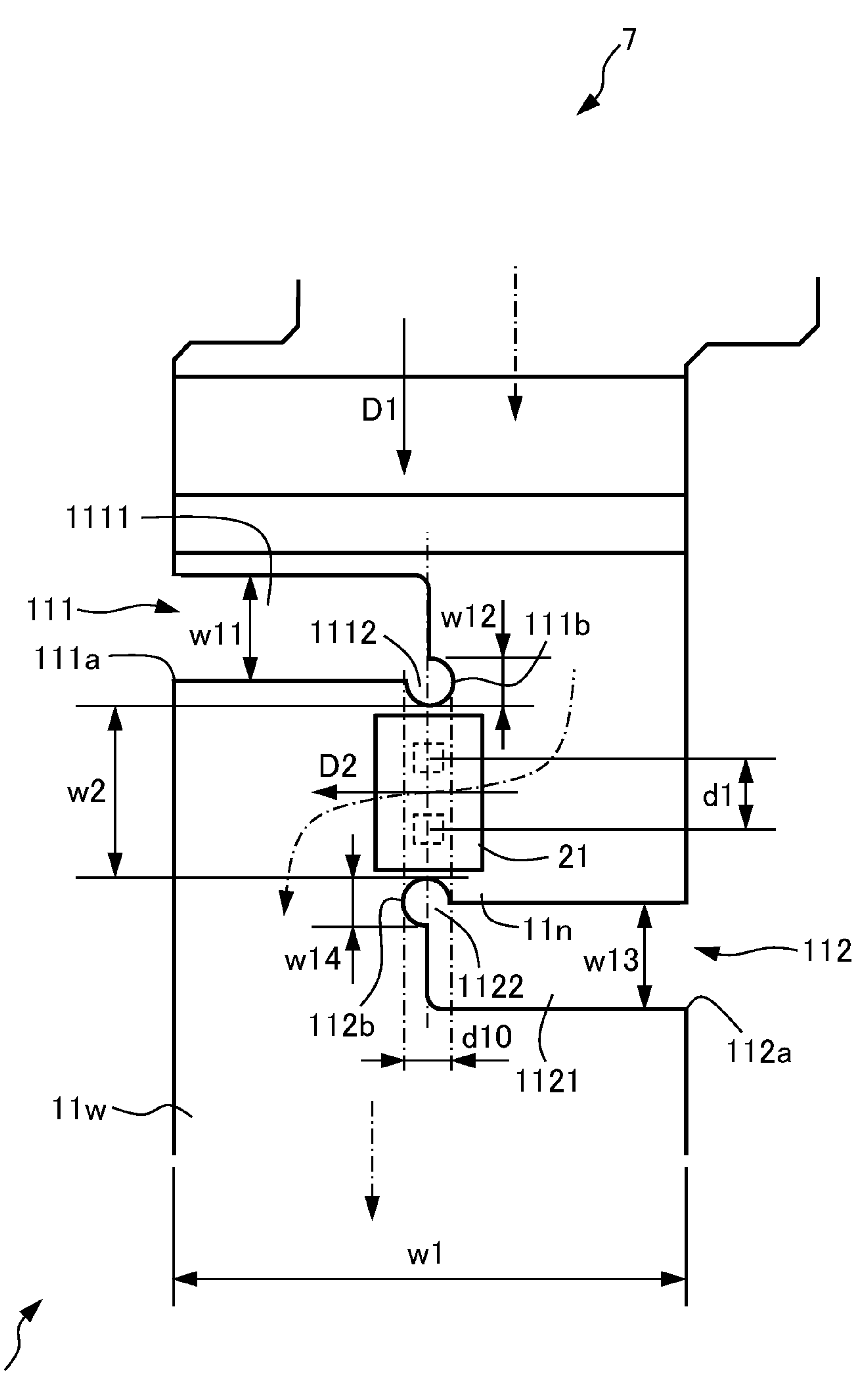
FIG. 12 is an enlarged plan view illustrating one bus bar of the electric current sensor device according to the second embodiment.
Figure 13A:
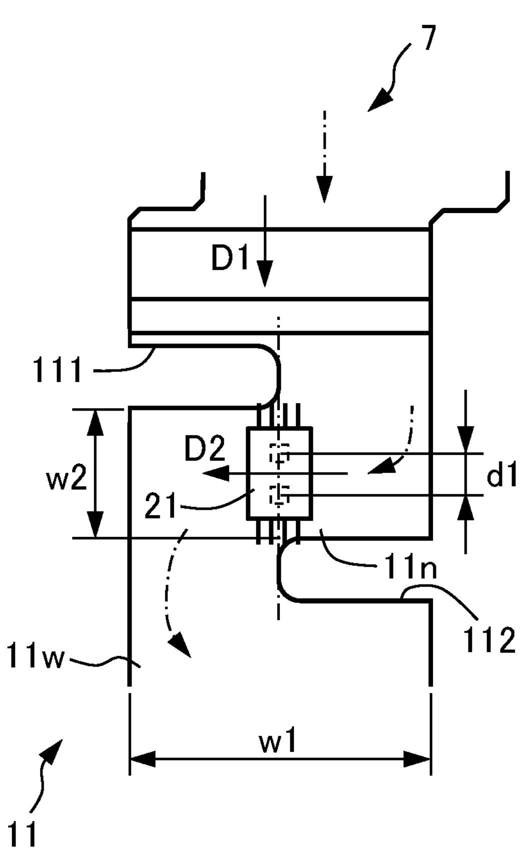
FIG. 13A is an enlarged plan view illustrating one bus bar of an electric current sensor device according to a comparative example, which is a first comparative example with a biting amount of 0 mm.
Figure 13B:
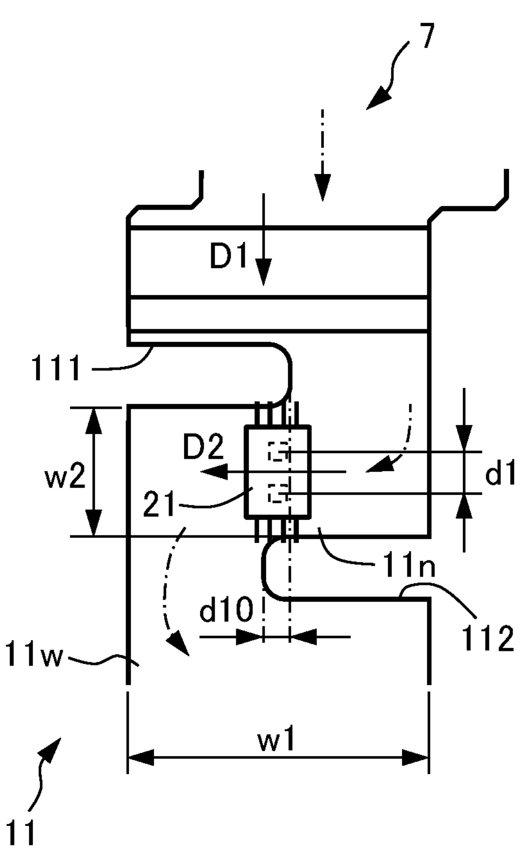
FIG. 13B is an enlarged plan view illustrating one bus bar of an electric current sensor device according to a comparative example, which is a second comparative example with a biting amount of 1 mm.
Figure 13C:
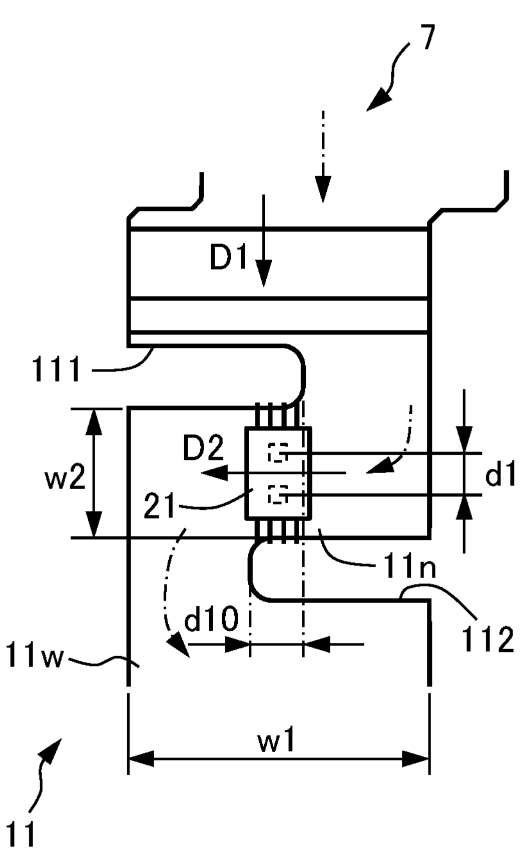
FIG. 13C is an enlarged plan view illustrating one bus bar of an electric current sensor device according to a comparative example, which is a third comparative example with a biting amount of 2 mm.
Figure 14A:
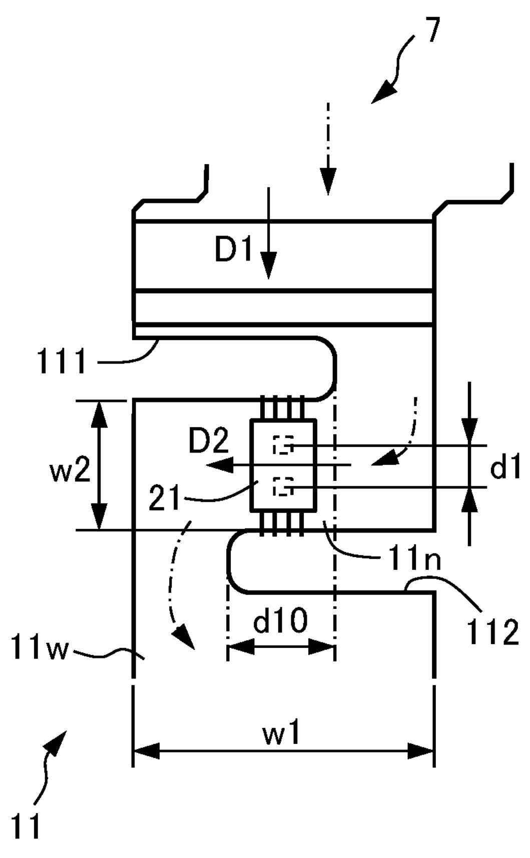
FIG. 14A is an enlarged plan view illustrating one bus bar of an electric current sensor device according to a comparative example, which is a fourth comparative example with a biting amount of 3 mm.
Figure 14B:
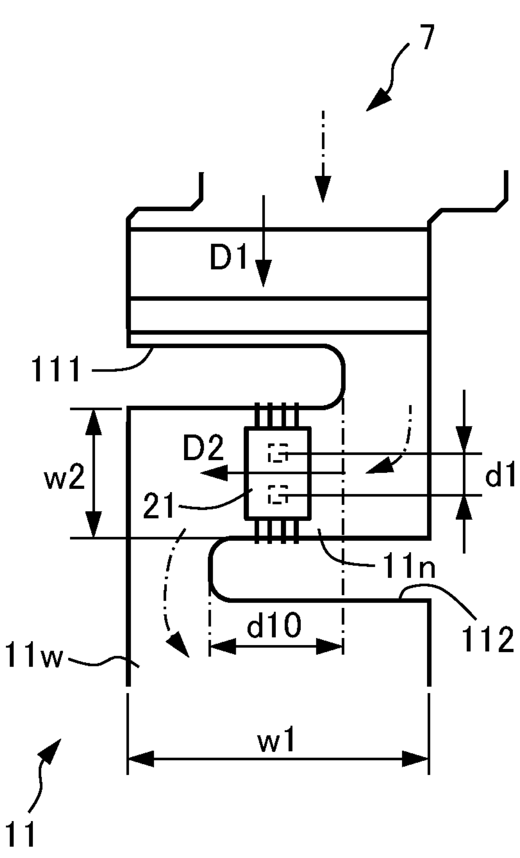
FIG. 14B is an enlarged plan view illustrating one bus bar of an electric current sensor device according to a comparative example, which is a fifth comparative example with a biting amount of 4 mm.

As described above, the second portion 1112 protruding in the direction opposite to the second direction D2 is disposed at the distal end portion of the first portion 1111 and the fourth portion 1122 protruding in the second direction D2 is disposed at the distal end portion of the third portion 1121, so that the current flowing through the bus bar 11 largely bypasses the first slit 111 and the second slit 112, and flows in the direction along the second direction D2 in the narrow portion 11*n* (see dashed-dotted lines in FIG. 12). Since the first Hall element 21*a* and the second Hall element 21*b* are arranged along the first direction D1 in the package 21, the magnetic flux density to be detected can be increased, and the S/N ratio can be improved to obtain high detection accuracy.

Example

Figure 15:
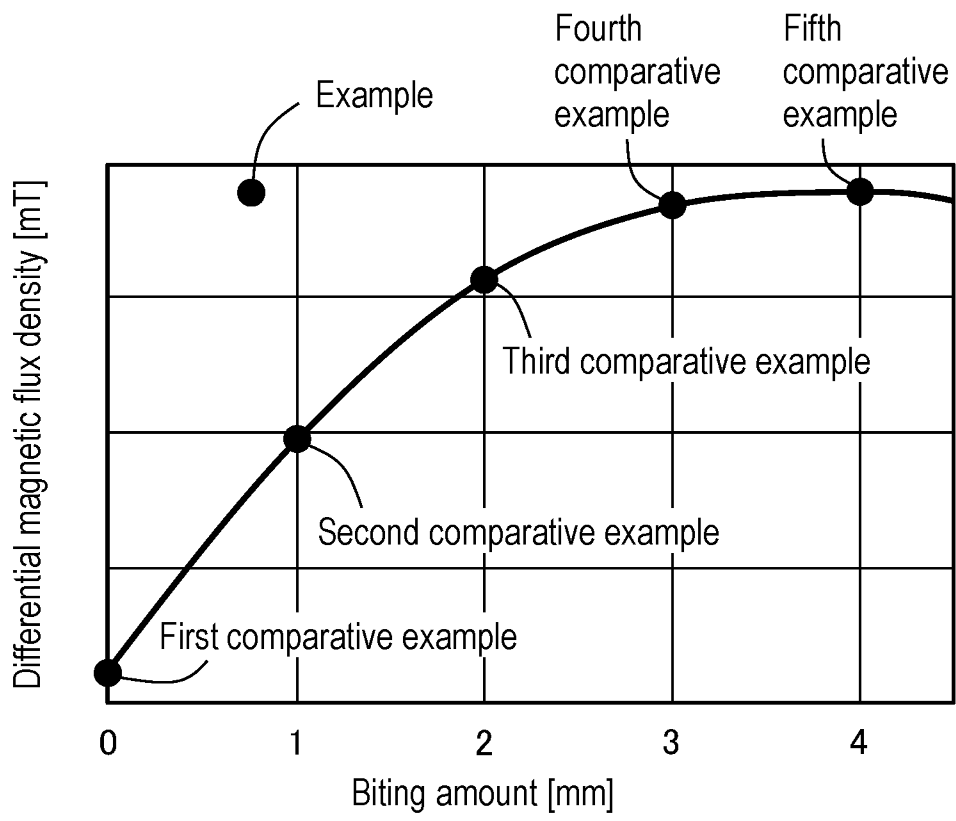
FIG. 15 is a graph illustrating a relationship between a biting amount and a differential magnetic flux density in an example and comparative examples.

Measurement was performed using the electric current sensor device 7 described above. Here, a current was caused to flow through the bus bar 11, and the differential magnetic flux density and the power loss were measured. The results are illustrated in FIG. 15. As illustrated in FIG. 15, a high value was obtained.

Comparative Example

Both the first slit 111 and the second slit 112 were formed in a substantially rectangular shape without the second portion, and the differential magnetic flux density and the power loss were measured in a first comparative example (FIG. 13A) in which the distal ends of the first slit and the second slit matched as viewed from the first direction D1, a second comparative example (FIG. 13B) in which the biting amount d10=1 mm, a third comparative example (FIG. 13C) in which the biting amount d10=2 mm, a fourth comparative example (FIG. 14A) in which the biting amount d10=3 mm, and a fifth comparative example (FIG. 14B) in which the biting amount d10=4 mm. The results are illustrated in FIG. 15. As illustrated in FIG. 15, in the first to fourth comparative examples, the differential magnetic flux density was lower than that in the example, and it was difficult to obtain higher detection accuracy than that in the example.

On the other hand, in the fifth comparative example, the differential magnetic flux density was equivalent to that in the example. However, in the fifth comparative example, the length of the narrow portion 11*n* in the second direction D2 was longer than that in the example, and thus heat was easily generated in the narrow portion 11*n*, and the power loss increased. As a result, it was confirmed that the electric current sensor device 7 of the example was most excellent in balance in view of both the differential magnetic flux density and the power loss as compared with the electric current sensor devices of the first to fifth comparative examples.

As described above, according to the electric current sensor device 7 of the present embodiment, the first slit 111 includes the second portion 1112 protruding in the direction opposite to the second direction D2, and the second slit 112 includes the fourth portion 1122 protruding in the second direction D2. In addition, when viewed from the first direction D1, at least a part of the second portion 1112 overlaps the second slit 112, and at least a part of the fourth portion 1122 overlaps the first slit 111. As a result, the current flowing through the bus bar 11 largely bypasses the first slit 111 and the second slit 112, and flows in the direction along the second direction D2 in the narrow portion 11*n* (see dashed-dotted lines in the drawing). Since the first Hall element 21*a* and the second Hall element 21*b* are arranged along the first direction D1 in the package 21, the magnetic flux density to be detected can be increased, and the S/N ratio can be improved to obtain high detection accuracy.

Therefore, the detection accuracy can be improved without reducing the narrow portion 11*n* more than necessary, and thus the electric current sensor device 7 can be downsized while heat generation is suppressed.

Here, when the first Hall element 21*a* and the second Hall element 21*b* are arranged in the narrow portion 11*n*, the amount of magnetic flux input to the first Hall element 21*a* and the second Hall element 21*b* decreases as compared with the case where the first Hall element and the second Hall element are disposed in the slits, and thus, there is a possibility that the S/N ratio decreases due to being easily affected by the disturbance magnetic flux. On the other hand, it is possible to increase the amount of input magnetic flux by increasing the biting amount d10 of the first slit 111 and the second slit 112, but in this case, the cross-sectional area of the bus bar 11 locally decreases, and local heat generation is concerned. In the present embodiment, the second portion 1112 is provided in the first slit 111 and the fourth portion 1122 is provided in the second slit 112, and thus the detection accuracy can be improved without increasing the biting amount d10 of the first slit 111 and the second slit 112, so that local heat generation can be suppressed.

Furthermore, according to the electric current sensor device 7 of the present embodiment, since the second portion 1112 and the fourth portion 1122 have an arc shape, and these portions do not have corners. As a result, for example, it is possible to suppress the possibility that stress concentration or the like occurs at the corner in a thermally expanded state, and to improve the durability of the bus bar 11.

In addition, according to the electric current sensor device 7 of the present embodiment, the electric current sensor device is provided in the inverter device 3 for the three-phase AC motor 2 mounted on the vehicle 1, and thus the vehicle 1 can be downsized.

Other Embodiments

Note that the case where the Hall element is applied as the magnetic detection element has been described in the present embodiment, but it is not limited thereto. That is, as long as the magnetic detection element can measure the magnetic flux generated by a current flow, for example, a magnetic impedance element, a magnetoresistive effect element, and the like can be widely applied as the magnetic detection element.

Figure 16:
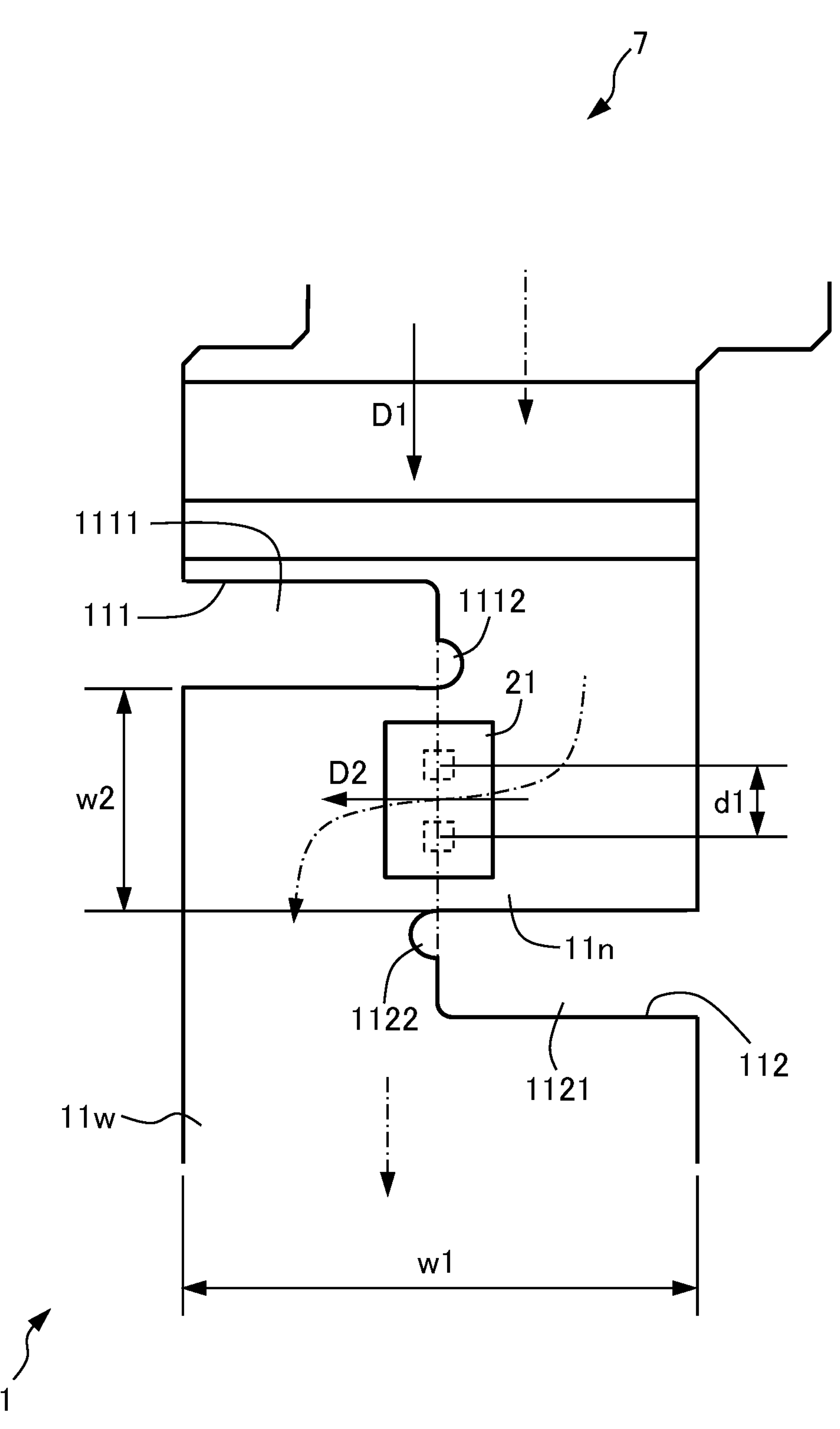
FIG. 16 is an enlarged plan view illustrating one bus bar of an electric current sensor device according to a modification of the second embodiment.

In addition, in the present embodiment described above, as illustrated in FIG. 12, in the first slit 111, the second portion 1112 has an approximately 270° arc shape around the vertex on the upstream side in the second direction D2 and the narrow portion 11*n* side of the first portion 1111, and in the second slit 112, the fourth portion 1122 has an approximately 270° arc shape around the vertex on the downstream side in the second direction D2 and the narrow portion 11*n* side of the third portion 1121, but it is not limited thereto. For example, as illustrated in FIG. 16, in the first slit 111, the second portion 1112 may have an approximately 180° arc shape around the narrow portion 11*n* side of the side on the upstream side in the second direction D2 of the first portion 1111. Similarly, in the second slit 112, the fourth portion 1122 may have an approximately 180° arc shape around the narrow portion 11*n* side of the side on the downstream side in the second direction D2 of the third portion 1121. In this case, as compared with the embodiment illustrated in FIG. 12, the second portion 1112 does not protrude to the narrow portion 11*n* side in the first slit 111, and the fourth portion 1122 does not protrude to the narrow portion 11*n* side in the second slit 112. Also in this case, the current flowing through the bus bar 11 largely bypasses the first slit 111 and the second slit 112, and flows in the direction along the second direction D2 in the narrow portion 11*n* (see dashed-dotted lines in the drawing). Therefore, the detection accuracy can be improved without reducing the narrow portion 11*n* more than necessary, and thus the electric current sensor device 7 can be downsized while heat generation is suppressed.

Figure 17:
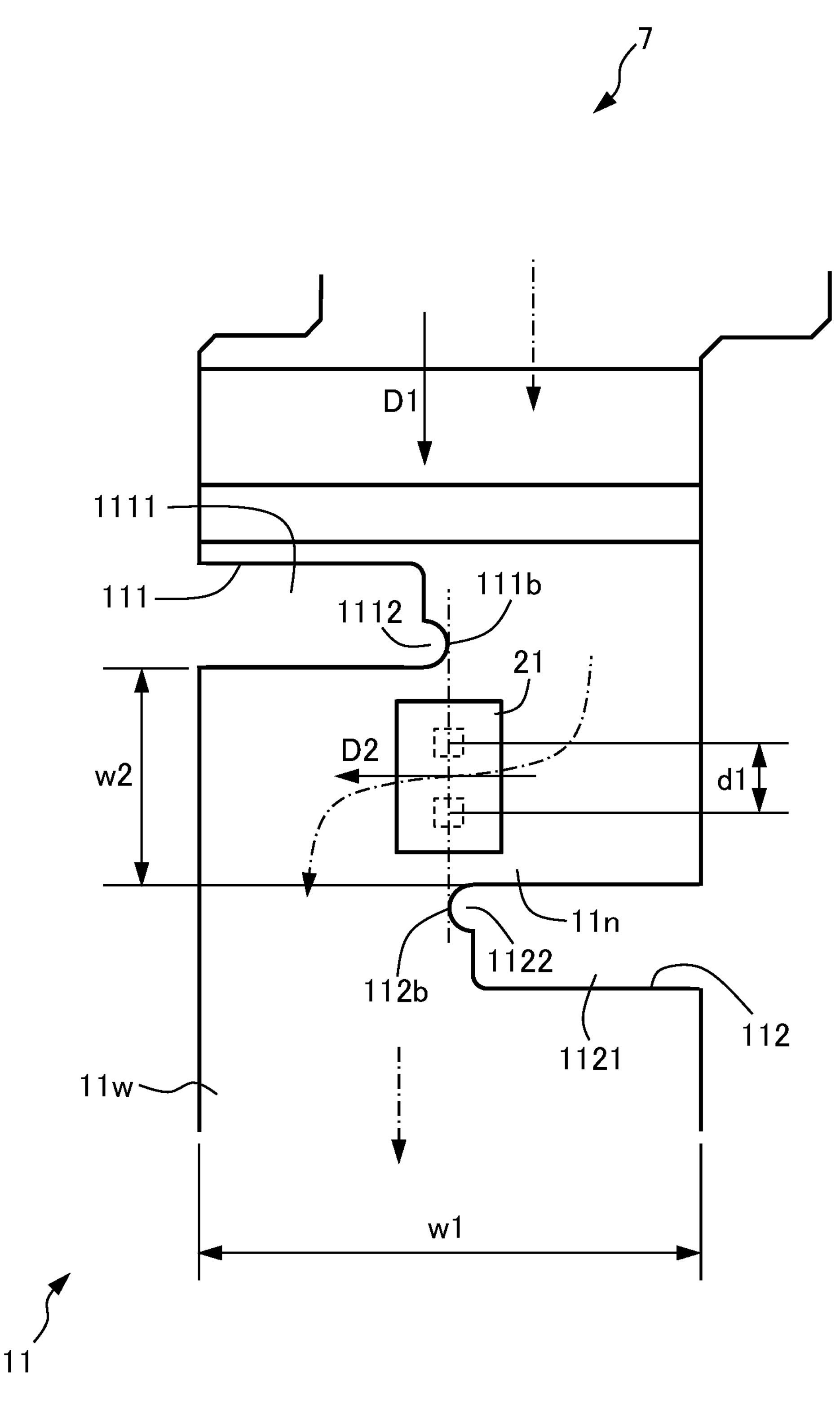
FIG. 17 is an enlarged plan view illustrating one bus bar of an electric current sensor device according to another modification of the second embodiment.

In addition, in the present embodiment described above, as illustrated in FIG. 12, when viewed from the first direction D1, the distal end of the first portion 1111 in the direction opposite to the second direction D2 matches the distal end of the third portion 1121 in the second direction D2, but it is not limited thereto. For example, as illustrated in FIG. 17, when viewed from the first direction D1, the distal end 111*b* of the second portion 1112 may match the distal end 112*b* of the fourth portion 1122. Also in this case, the current flowing through the bus bar 11 largely bypasses the first slit 111 and the second slit 112, and flows in the direction along the second direction D2 in the narrow portion 11*n* (see dashed-dotted lines in the drawing). Therefore, the detection accuracy can be improved without reducing the narrow portion 11*n* more than necessary, and thus the electric current sensor device 7 can be downsized while heat generation is suppressed. As described above, as illustrated in each embodiment, as the relative positions of the first slit 111 and the second slit 112, when viewed from the first direction D1, the distal end 111*b* of the first slit 111 matches the distal end 112*b* of the second slit 111, or at least a part of the second portion 1112 overlaps the second slit 112, or at least a part of the fourth portion 1122 overlaps the first slit 111.

Figure 18:
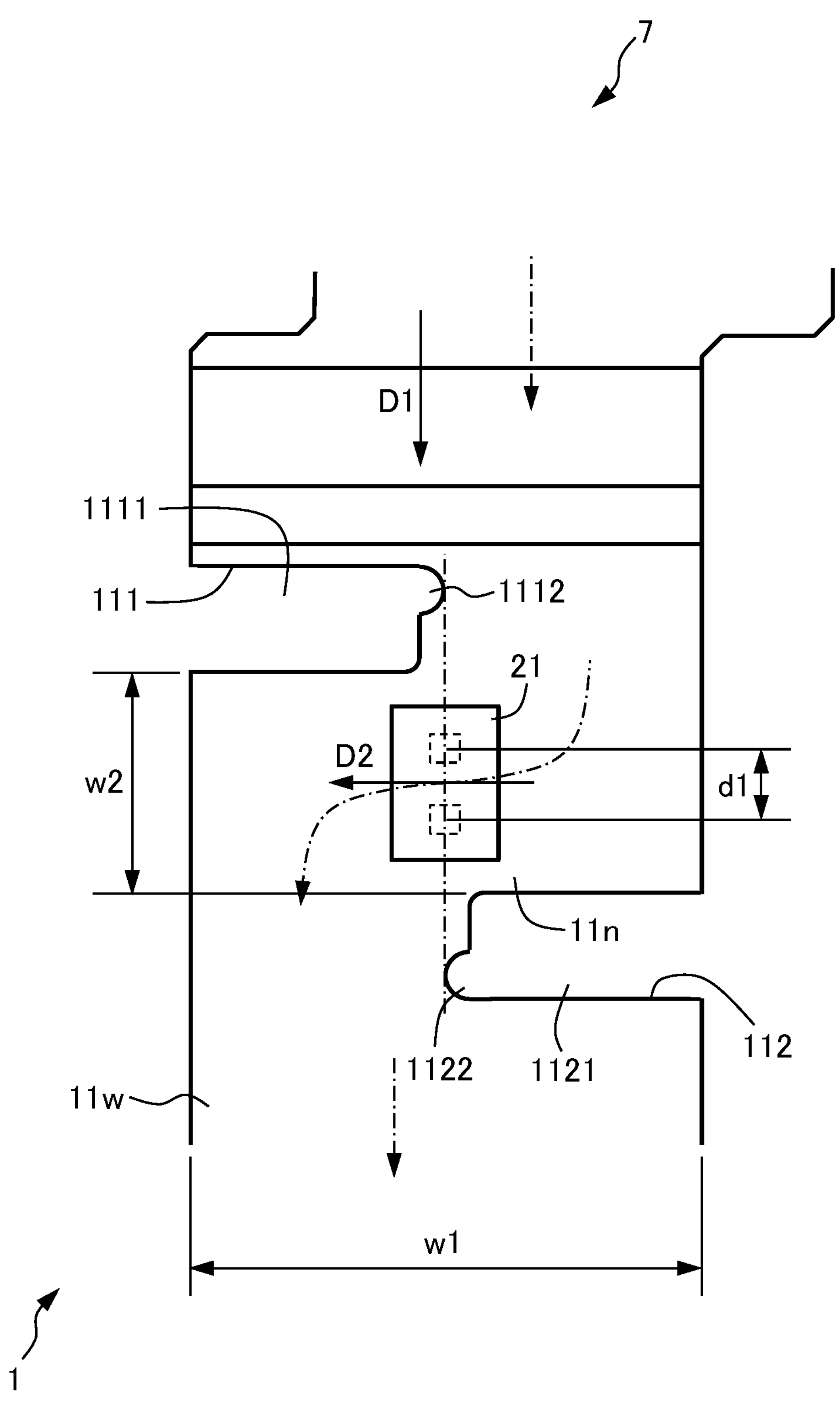
FIG. 18 is an enlarged plan view illustrating one bus bar of an electric current sensor device according to still another modification of the second embodiment.

In addition, in the example illustrated in FIG. 17, in the first slit 111, the second portion 1112 has an approximately 180° arc shape around the narrow portion 11*n* side of the side on the upstream side in the second direction D2 of the first portion 1111, and in the second slit 112, the fourth portion 1122 has an approximately 180° arc shape around the narrow portion 11*n* side of the side on the downstream side in the second direction D2 of the third portion 1121, but it is not limited thereto. For example, as illustrated in FIG. 18, in the first slit 111, the second portion 1112 may have an approximately 180° arc shape around the side opposite to the narrow portion 11*n* side of the side on the upstream side in the second direction D2 of the first portion 1111. Similarly, in the second slit 112, the fourth portion 1122 may have an approximately 180° arc shape around the side opposite to the narrow portion 11*n* side of the side on the downstream side in the second direction D2 of the third portion 1121. Also in this case, the current flowing through the bus bar 11 largely bypasses the first slit 111 and the second slit 112, and flows in the direction along the second direction D2 in the narrow portion 11*n* (see dashed-dotted lines in the drawing). Therefore, the detection accuracy can be improved without reducing the narrow portion 11*n* more than necessary, and thus the electric current sensor device 7 can be downsized while heat generation is suppressed.

Furthermore, the case where the second portion 1112 and the fourth portion 1122 have an arc shape has been in each of the embodiments, but it is not limited thereto. For example, the second portion 1112 and the fourth portion 1122 may have a quadrangular shape or a substantially triangular shape in which the distal end 111*b*, 112*b* side is thinned.

In addition, the case where the first slit 111 includes the second portion 1112 and the second slit 112 includes the fourth portion 1122 has been described in each of the embodiments, but it is not limited thereto. For example, it may be configured that the first slit 111 includes the second portion 1112 and the second slit 112 does not include the fourth portion 1122, or it may be configured that the first slit 111 does not include the second portion 1112 and the second slit 112 includes the fourth portion 1122. Since at least one of the first slit 111 or the second slit 112 includes the second portion 1112 or the fourth portion 1122, the current flowing through the bus bar 11 can bypass the first slit 111 and the second slit 112 as compared with a case where the second portion or the fourth portion is not provided.

Summary of Present Embodiment

Preferably, the electric current sensor device (7) includes a conductor (11, 12, 13), and a detector (21, 22, 23) including a first magnetic detection element (21*a*, 22*a*, 23*a*) and a second magnetic detection element (21*b*, 22*b*, 23*b*) that detect magnetism generated by a current flowing through the conductor (11, 12, 13), and the detector detecting a current of the conductor (11, 12, 13) based on detection results of the first magnetic detection element (21*a*, 22*a*, 23*a*) and the second magnetic detection element (21*b*, 22*b*, 23*b*), and in the electric current sensor device, the conductor (11, 12, 13) includes a wide portion (11*w*, 12*w*, 13*w*) through which a current flows in a first direction (D1) and whose width in a direction orthogonal to the first direction (D1) is a first width (w1), a narrow portion (11*n*, 12*n*, 13*n*) through which a current flows in a second direction (D2) intersecting the first direction (D1) and whose width in a direction orthogonal to the second direction (D2) is a second width (w2) narrower than the first width (w1), a first recess (111, 121, 131) defining an upstream side in the first direction (D1) of the narrow portion (11*n*, 12*n*, 13*n*) and having a shape recessed in a direction opposite to the second direction (D2) with a side edge on a downstream side in the second direction (D2) of two side edges of the wide portion (11*w*, 12*w*, 13*w*) as a proximal end (111*a*), and a second recess (112, 122, 132) defining a downstream side in the first direction (D1) of the narrow portion (11*n*, 12*n*, 13*n*) and having a shape recessed in the second direction (D2) with a side edge on an upstream side in the second direction (D2) of two side edges of the wide portion (11*w*, 12*w*, 13*w*) as a proximal end (112*a*), the first magnetic detection element (21*a*, 22*a*, 23*a*) and the second magnetic detection element (21*b*, 22*b*, 23*b*) are arranged in a stacking direction (Dz) of a surface of the narrow portion (11*n*, 12*n*, 13*n*), and are arranged side by side in a direction along the surface of the narrow portion (11*n*, 12*n*, 13*n*), in the first recess (111, 121, 131), a width in the first direction (D1) of a first portion (1111) including the proximal end (111*a*) is defined as a first recess width (w11), and a width in the first direction (D1) of a second portion (1112) including a distal end (111*b*) in a direction opposite to the second direction (D2) is defined as a second recess width (w12) smaller than the first recess width (w11), and when viewed from the first direction (D1), a distal end (111*b*) of the first recess (111, 121, 131) matches a distal end (112*b*) of the second recess (112, 122, 132), or at least a part of the second portion (1112) overlaps the second recess (112, 122, 132).

As a result, in the electric current sensor device (7), the current flowing through the conductor (11, 12, 13) largely bypasses the first recess (111, 121, 131) and the second recess (112, 122, 132), and flows in the direction along the second direction (D2) in the narrow portion (11*n*, 12*n*, 13*n*) (see dashed-dotted lines in FIG. 17). Since the first magnetic detection element (21*a*, 22*a*, 23*a*) and the second magnetic detection element (21*b*, 22*b*, 23*b*) are arranged along the first direction D1 in the detector (21, 22, 23), the magnetic flux density to be detected can be increased, and the S/N ratio can be improved to obtain high detection accuracy. Therefore, the detection accuracy can be improved without reducing the narrow portion (11*n*, 12*n*, 13*n*) more than necessary, and thus the electric current sensor device (7) can be downsized while heat generation is suppressed.

Furthermore, preferably in the electric current sensor device (7), in the second recess (112, 122, 132), a width in the first direction (D1) of a third portion including the proximal end (112*a*) is defined as a third recess width (w13), and a width in the first direction (D1) of a fourth portion (1122) including a distal end (112*b*) in the second direction (D2) is defined as a fourth recess width (w14) smaller than the third recess width (w13), and when viewed from the first direction (D1), a distal end (111*b*) of the first recess (111, 121, 131) matches a distal end (112*b*) of the second recess (112, 122, 132), or at least a part of the fourth portion (1122) overlaps the first recess (111, 121, 131).

As a result, in the electric current sensor device (7), the current flowing through the conductor (11, 12, 13) more largely bypasses the first recess (111, 121, 131) and the second recess (112, 122, 132), and flows in the direction along the second direction (D2) in the narrow portion (11*n*, 12*n*, 13*n*) (see dashed-dotted lines in FIG. 17). Therefore, the detection accuracy can be improved without reducing the narrow portion (11*n*, 12*n*, 13*n*) more than necessary, and thus the electric current sensor device (7) can be downsized while heat generation is suppressed.

In addition, in the electric current sensor device (7), the second portion (1112) preferably has an arcuate outer shape.

As a result, in the electric current sensor device (7), the second portion (1112) has an arc shape and thus does not have a corner. Therefore, for example, it is possible to suppress the possibility that stress concentration or the like occurs at the corner in a thermally expanded state, and to improve the durability of the conductor (11, 12, 13).

Preferably, in the electric current sensor device (7), the first portion (1111) has a cutout shape, and the second portion (1112) is continuously formed at a distal end portion of the first portion.

As a result, in the electric current sensor device (7), the first recess (111, 121, 131) and the second recess (112, 122, 132) can be formed at a time by, for example, punching the conductor (11, 12, 13), and the manufacturing process can be simplified.

Preferably, in the electric current sensor device (7), the conductor (11, 12, 13) is connected between an inverter circuit (5) that operates a rotary electric machine (2) operating with a three-phase alternating current and any one of three-phase coils of the rotary electric machine (2), and the first magnetic detection element (21*a*, 22*a*, 23*a*) and the second magnetic detection element (21*b*, 22*b*, 23*b*) are arranged along the first direction (D1).

As a result, in the electric current sensor device (7), the electric current sensor device is provided in the inverter circuit (5) of the rotary electric machine (2) that is mounted on the vehicle (1) and operates with a three-phase alternating current, the vehicle (1) can be downsized.

INDUSTRIAL APPLICABILITY

The present disclosure is industrially applicable as an electric current sensor device that measures a current in an inverter device or the like for a three-phase AC motor mounted on an electric vehicle such as an automobile or a truck.

REFERENCE SIGNS LIST

2: Three-phase AC motor (rotary electric machine), 5: Inverter circuit, 7: Electric current sensor device, 11: Bus bar (first conductor, conductor), 11*n*: Narrow portion (first narrow portion), 11*w*: Wide portion (first wide portion), 12: Bus bar (second conductor, conductor), 12*n*: Narrow portion (second narrow portion), 12*w*: Wide portion (second wide portion), 13: Bus bar (third conductor, conductor), 13*n*: Narrow portion (third narrow portion), 13*w*: Wide portion (third wide portion), 14: board (first board, second board), 21: Package (first detector, detector), 21*a*: First Hall element (first magnetic detection element), 21*b*: Second Hall element (second magnetic detection element), 22: Package (second detector, detector), 22*a*: Third Hall element (third magnetic detection element, first magnetic detection element), 22*b*: Fourth Hall element (fourth magnetic detection element, second magnetic detection element), 23: Package (third detector, detector), 23*a*: Fifth Hall element (fifth magnetic detection element, first magnetic detection element), 23*b*: Sixth Hall element (sixth magnetic detection element, second magnetic detection element), 111, 121, 131: First slit (first recess), 111*a*: Proximal end, 111*b*: Distal end, 112, 122, 132: Second slit (second recess), 112*a*: Proximal end, 112*b*: Distal end, 1111: First portion, 1112: Second portion, 1121: Third portion, 1122: Fourth portion, D1: First direction, D2: Second direction, D3: Third direction, D4: Fourth direction, D5: Fifth direction, D6: Sixth direction, Dz: Stacking direction (first stacking direction, second stacking direction, third stacking direction), S: Space (first air layer, second air layer), w1: First width, w2: Second width w3: Third width, w4: Fourth width, w5: Fifth width, w6: Sixth width, w11: First recess width, w12: Second recess width, w13: Third recess width, and w14: Fourth recess width

The invention claimed is:

1. An electric current sensor device comprising:

a first conductor and a second conductor arranged at a predetermined interval;

a first detector including a first magnetic detection element and a second magnetic detection element that detect magnetism generated by a current flowing through the first conductor, and the first detector detecting a current of the first conductor based on detection results of the first magnetic detection element and the second magnetic detection element; and a second detector including a third magnetic detection element and a fourth magnetic detection element that detect magnetism generated by a current flowing through the second conductor, and the second detector detecting a current of the second conductor based on detection results of the third magnetic detection element and the fourth magnetic detection element, wherein the first conductor includes a first wide portion through which a current flows in a first direction and whose width in a direction orthogonal to the first direction is a first width, and a first narrow portion through which a current flows in a second direction intersecting the first direction and whose width in a direction orthogonal to the second direction is a second width narrower than the first width, the first magnetic detection element and the second magnetic detection element are arranged in a first stacking direction of a surface of the first narrow portion, and are arranged side by side in a direction along the surface of the first narrow portion, the second conductor includes a second wide portion through which a current flows in a third direction and whose width in a direction orthogonal to the third direction is a third width, and a second narrow portion through which a current flows in a fourth direction intersecting the third direction and whose width in a direction orthogonal to the fourth direction is a fourth width narrower than the third width, the third magnetic detection element and the fourth magnetic detection element are arranged in a second stacking direction of a surface of the second narrow portion, and are arranged side by side in a direction along the surface of the second narrow portion, the second width of the first narrow portion is twice or more and three times or less a pitch between arrangement positions of the first magnetic detection element and the second magnetic detection element, and the fourth width of the second narrow portion is twice or more and three times or less a pitch of arrangement positions of the third magnetic detection element and the fourth magnetic detection element.

2. The electric current sensor device according to claim 1, further comprising:

a first board on which the first detector is mounted; and a second board on which the second detector is mounted, wherein the first conductor, the first detector, and the first board are stacked in the first stacking direction, and a first air layer is interposed between the first conductor and the first detector, and the second conductor, the second detector, and the second board are stacked in the second stacking direction, and a second air layer is interposed between the second conductor and the second detector.

3. The electric current sensor device according to claim 1, further comprising:

a third conductor disposed at a predetermined interval from the second conductor; and a third detector including a fifth magnetic detection element and a sixth magnetic detection element that detect magnetism generated by a current flowing through the third conductor, and the third detector detecting a current of the third conductor based on detection results of the fifth magnetic detection element and the sixth magnetic detection element, wherein the third conductor includes a third wide portion through which a current flows in a fifth direction and whose width in a direction orthogonal to the fifth direction is a fifth width, and a third narrow portion through which a current flows in a sixth direction intersecting the fifth direction and whose width in a direction orthogonal to the sixth direction is a sixth width narrower than the fifth width, the fifth magnetic detection element and the sixth magnetic detection element are arranged in a third stacking direction of a surface of the third narrow portion, and are arranged side by side in a direction along the surface of the third narrow portion, and the first detector, the second detector, and the third detector are connected to first-phase, second-phase, and third-phase coils of a rotary electric machine that operates with a three-phase alternating current via the first conductor, the second conductor, and the third conductor, respectively.

4. The electric current sensor device according to claim 1, wherein the first conductor includes a first recess defining an upstream side in the first direction of the first narrow portion and having a shape recessed in a direction opposite to the second direction with a side edge on a downstream side in the second direction of two side edges of the first wide portion as a proximal end, and a second recess defining a downstream side in the first direction of the first narrow portion and having a shape recessed in the second direction with a side edge on an upstream side in the second direction of two side edges of the first wide portion as a proximal end, in the first recess, a width in the first direction of a first portion including the proximal end is defined as a first recess width, and a width in the first direction of a second portion including a distal end in a direction opposite to the second direction is defined as a second recess width smaller than the first recess width, and when viewed from the first direction, a distal end of the first recess matches a distal end of the second recess, or at least a part of the second portion overlaps the second recess.

5. The electric current sensor device according to claim 4, wherein in the second recess, a width in the first direction of a third portion including the proximal end is defined as a third recess width, and a width in the first direction of a fourth portion including a distal end in the second direction is defined as a fourth recess width smaller than the third recess width, and when viewed from the first direction, a distal end of the first recess matches a distal end of the second recess, or at least a part of the fourth portion overlaps the first recess.

6. The electric current sensor device according to claim 4, wherein the second portion has an arcuate outer shape.

7. The electric current sensor device according to claim 4, wherein the first portion has a cutout shape, and the second portion is continuously formed at a distal end portion of the first portion.

8. An electric current sensor device comprising:

a conductor; and a detector including a first magnetic detection element and a second magnetic detection element that detect magnetism generated by a current flowing through the conductor, and the detector detecting a current of the conductor based on detection results of the first magnetic detection element and the second magnetic detection element, wherein the conductor includes a wide portion through which a current flows in a first direction and whose width in a direction orthogonal to the first direction is a first width, a narrow portion through which a current flows in a second direction intersecting the first direction and whose width in a direction orthogonal to the second direction is a second width narrower than the first width, a first recess defining an upstream side in the first direction of the narrow portion and having a shape recessed in a direction opposite to the second direction with a side edge on a downstream side in the second direction of two side edges of the wide portion as a proximal end, and a second recess defining a downstream side in the first direction of the narrow portion and having a shape recessed in the second direction with a side edge on an upstream side in the second direction of two side edges of the wide portion as a proximal end, the first magnetic detection element and the second magnetic detection element are arranged in a stacking direction of a surface of the narrow portion, and are arranged side by side in a direction along the surface of the narrow portion, in the first recess, a width in the first direction of a first portion including the proximal end is defined as a first recess width, and a width in the first direction of a second portion including a distal end in a direction opposite to the second direction is defined as a second recess width smaller than the first recess width, and when viewed from the first direction, a distal end of the first recess matches a distal end of the second recess, or at least a part of the second portion overlaps the second recess.

9. The electric current sensor device according to claim 8, wherein in the second recess, a width in the first direction of a third portion including the proximal end is defined as a third recess width, and a width in the first direction of a fourth portion including a distal end in the second direction is defined as a fourth recess width smaller than the third recess width, and when viewed from the first direction, a distal end of the first recess matches a distal end of the second recess, or at least a part of the fourth portion overlaps the first recess.

10. The electric current sensor device according to claim 8, wherein the second portion has an arcuate outer shape.

11. The electric current sensor device according to claim 8, wherein the first portion has a cutout shape, and the second portion is continuously formed at a distal end portion of the first portion.

12. The electric current sensor device according to claim 8, wherein the conductor is connected between an inverter circuit that operates a rotary electric machine operating with a three-phase alternating current and any one of three-phase coils of the rotary electric machine, and the first magnetic detection element and the second magnetic detection element are arranged along the first direction.

* * * * *